(12) United States Patent
Sneh

(10) Patent No.: US 8,012,261 B2
(45) Date of Patent: Sep. 6, 2011

(54) ALD APPARATUS AND METHOD

(75) Inventor: Ofer Sneh, Boulder, CO (US)

(73) Assignee: Sundew Technologies, LLC, Broomfield, CO (US)

( * ) Notice: Subject to any disclaimer, the term of this patent is extended or adjusted under 35 U.S.C. 154(b) by 42 days.

(21) Appl. No.: 12/613,722

(22) Filed: Nov. 6, 2009

(65) Prior Publication Data

US 2010/0043888 A1     Feb. 25, 2010

Related U.S. Application Data

(62) Division of application No. 11/076,772, filed on Mar. 10, 2005, now Pat. No. 7,635,502, which is a division of application No. 10/347,575, filed on Jan. 17, 2003, now Pat. No. 6,911,092.

(60) Provisional application No. 60/349,634, filed on Jan. 17, 2002.

(51) Int. Cl.
*C23C 16/00* (2006.01)

(52) U.S. Cl. ........................ 118/733; 118/715

(58) Field of Classification Search .................. 118/715, 118/733
See application file for complete search history.

(56) References Cited

U.S. PATENT DOCUMENTS

| | | | |
|---|---|---|---|
| 4,058,430 A | 11/1977 | Suntola et al. |
| 4,389,973 A | 6/1983 | Suntola et al. |
| 4,413,022 A | 11/1983 | Suntola et al. |
| 4,809,950 A | 3/1989 | Geiser |
| 4,854,263 A | 8/1989 | Chang et al. |
| 4,960,488 A | 10/1990 | Law et al. |
| 4,993,357 A | 2/1991 | Scholz |
| 5,114,683 A | 5/1992 | Hirase |
| 5,225,366 A | 7/1993 | Yoder |
| 5,281,274 A | 1/1994 | Yoder |
| 5,330,610 A | 7/1994 | Eres et al. |
| 5,356,476 A | 10/1994 | Foster et al. |
| 5,386,798 A | 2/1995 | Lowndes et al. |
| 5,483,919 A | 1/1996 | Yokoyama et al. |
| 5,582,866 A | 12/1996 | White |
| 5,685,914 A | 11/1997 | Hills et al. |
| 5,711,811 A | 1/1998 | Suntola et al. |
| 5,730,802 A | 3/1998 | Ishizumi et al. |
| 5,758,680 A | 6/1998 | Kaveh et al. |
| 5,772,770 A | 6/1998 | Suda et al. |
| 5,834,371 A | 11/1998 | Ameen et al. |
| 5,849,092 A | 12/1998 | Xi et al. |
| 5,855,680 A | 1/1999 | Soininen et al. |
| 5,904,800 A | 5/1999 | Mautz |

(Continued)

FOREIGN PATENT DOCUMENTS

JP     1992-4261016 A     9/1992

(Continued)

OTHER PUBLICATIONS

In the US Patent and Trademark Office U.S. Appl. No. 11/076,772, Non-Final Office Action dated Aug. 27, 2008, 8 pages; and response dated Jan. 5, 2009, 10 pages.

(Continued)

*Primary Examiner* — Jeffrie R Lund

(74) *Attorney, Agent, or Firm* — Patton Boggs LLP

(57) ABSTRACT

An apparatus and method for atomic layer deposition with improved efficiency of both chemical dose and purge is presented. The apparatus includes an integrated equipment and procedure for chamber maintenance.

5 Claims, 16 Drawing Sheets

U.S. PATENT DOCUMENTS

| | | | |
|---|---|---|---|
| 5,914,278 | A | 6/1999 | Boitnott et al. |
| 5,919,332 | A | 7/1999 | Koshiishi et al. |
| 5,928,426 | A | 7/1999 | Aitchison |
| 6,015,590 | A | 1/2000 | Suntola et al. |
| 6,056,824 | A | 5/2000 | Bartholomew et al. |
| 6,063,198 | A | 5/2000 | Bang et al. |
| 6,174,377 | B1 | 1/2001 | Doering et al. |
| 6,223,684 | B1 | 5/2001 | Fujioka et al. |
| 6,305,314 | B1 | 10/2001 | Sneh et al. |
| 6,355,561 | B1 | 3/2002 | Sandhu et al. |
| 6,361,607 | B2 | 3/2002 | Dozoretz et al. |
| 6,432,256 | B1 | 8/2002 | Raoux |
| 6,447,607 | B2 | 9/2002 | Soininen et al. |
| 6,506,352 | B1 | 1/2003 | Lindfors et al. |
| 6,527,911 | B1 | 3/2003 | Yen et al. |
| 6,544,341 | B1 | 4/2003 | Omstead et al. |
| 6,761,796 | B2 | 7/2004 | Srivastava et al. |
| 6,796,316 | B2 | 9/2004 | Park |
| 6,800,173 | B2 * | 10/2004 | Chiang et al. ............ 156/345.33 |
| 6,884,297 | B2 | 4/2005 | Park et al. |
| 6,899,764 | B2 | 5/2005 | Frijlink |
| 6,911,092 | B2 * | 6/2005 | Sneh ............................ 118/715 |
| 6,998,152 | B2 | 2/2006 | Uhlenbrock |
| 7,189,432 | B2 | 3/2007 | Chiang et al. |
| 7,250,083 | B2 | 7/2007 | Sneh |
| 7,276,124 | B2 * | 10/2007 | Gurary et al. ................. 118/719 |
| 7,335,277 | B2 * | 2/2008 | Makino et al. ........... 156/345.32 |
| 7,635,502 | B2 * | 12/2009 | Sneh ......................... 427/248.1 |
| 7,662,233 | B2 * | 2/2010 | Sneh ............................ 118/724 |
| 7,682,454 | B2 * | 3/2010 | Sneh ............................. 118/719 |
| 2002/0076490 | A1 * | 6/2002 | Chiang et al. .............. 427/248.1 |
| 2002/0127336 | A1 | 9/2002 | Chen et al. |
| 2002/0129768 | A1 | 9/2002 | Carpenter et al. |
| 2002/0144786 | A1 * | 10/2002 | Chiang et al. ............ 156/345.51 |
| 2002/0187084 | A1 | 12/2002 | Lindfors et al. |
| 2003/0180458 | A1 * | 9/2003 | Sneh ........................... 427/248.1 |
| 2004/0083978 | A1 * | 5/2004 | Welch et al. .................. 118/733 |
| 2004/0149214 | A1 * | 8/2004 | Hirose et al. .................. 118/715 |
| 2004/0187779 | A1 | 9/2004 | Park et al. |
| 2005/0051100 | A1 * | 3/2005 | Chiang et al. ................. 118/728 |
| 2005/0160983 | A1 * | 7/2005 | Sneh ............................. 118/715 |
| 2007/0051312 | A1 * | 3/2007 | Sneh ............................. 118/719 |
| 2007/0269983 | A1 * | 11/2007 | Sneh ............................. 438/689 |
| 2009/0095621 | A1 * | 4/2009 | Kao et al. .................. 204/298.32 |
| 2010/0043888 | A1 * | 2/2010 | Sneh ............................... 137/14 |
| 2010/0129548 | A1 * | 5/2010 | Sneh ......................... 427/248.1 |
| 2010/0166957 | A1 * | 7/2010 | Sneh ....................... 427/255.28 |

FOREIGN PATENT DOCUMENTS

| | | |
|---|---|---|
| JP | 2002-151489 A | 5/2002 |
| WO | WO-99-10558 A1 | 3/1999 |

OTHER PUBLICATIONS

In the US Patent and Trademark Office U.S. Appl. No. 11/076,772, Final Office Action dated Mar. 25, 2009, 10 pages; and response dated Aug. 25, 2009, 14 pages, including a Request for Continued Examination.

Sneh et al.; "Thin film atomic layer disposition equipment for semiconductor processing"; Thin Solid Films, 2002; pp. 248-261; Elsevier Science B.V.

* cited by examiner

ALD APPARATUS AND METHOD

CROSS-REFERENCE TO RELATED APPLICATIONS

This application is a Divisional of U.S. patent application Ser. No. 11/076,772 filed on Mar. 10, 2005, which is a Divisional of U.S. patent application Ser. No. 10/347,575 filed on Jan. 17, 2003, now U.S. Pat. No. 6,911,092 issued Jun. 28, 2005, which claims the benefit of U.S. Provisional Application No. 60/349,634 filed on Jan. 17, 2002. All of the above patent applications, both provisional and non-provisional, are hereby incorporated by reference to the same extent as though fully contained herein.

BACKGROUND OF THE INVENTION

This invention relates to the field of atomic layer deposition ("ALD"), and more particularly to systems and methods for performing ALD with high throughput and low cost.

Thin film deposition is commonly practiced in the fabrication of semiconductor devices and many other useful devices. Well-known techniques of chemical vapor deposition ("CVD") utilize chemically reactive molecules that react in a reaction chamber to deposit a desired film on a substrate. Molecular precursors useful for CVD applications comprise elemental (atomic) constituents of the film to be deposited and typically additional elements. CVD precursors are volatile molecules that can be practically delivered, in the gas phase, to react at the substrate.

Conventional CVD is practiced in the art by a variety of techniques. Desired thin film properties and cost-effective operational parameters influence the choice of equipment, precursor composition, pressure range, temperature, and other variables. Many different apparatuses and methods have been successfully implemented. Common to most CVD techniques is the application of a well-controlled flux of one or more molecular precursors into the CVD reactor. A substrate is kept at a well-controlled temperature under well-controlled pressure conditions to promote chemical reaction between the molecular precursors concurrent with efficient desorption of byproducts. The chemical reaction is allowed to proceed to deposit the desired thin film with a desired film thickness.

Optimum CVD performance directly correlates with the ability to achieve and sustain steady-state conditions of flux, temperature, and pressure throughout the process, in which unavoidable transients are suppressed or minimized. CVD has provided uniform and conformal coatings with reproducible thickness and exceptional quality.

Nevertheless, as device density increases and device geometry becomes more complicated in integrated circuit devices, the need for thinner films with superior conformal coating properties has approached the limits of conventional CVD techniques and new techniques are needed. An emerging variant of CVD, atomic layer deposition ("ALD"), offers superior thickness control and conformality for advanced thin film deposition.

ALD is practiced by dividing conventional thin-film deposition processes into single atomic-layer deposition steps that are self-terminating and deposit precisely one atomic layer when conducted up to or beyond self-termination exposure times. An atomic layer typically equals about 0.1 molecular monolayer to 0.5 molecular monolayer. The deposition of an atomic layer is the outcome of a chemical reaction between a reactive molecular precursor and the substrate. In each separate ALD reaction-deposition step, the net reaction deposits the desired atomic layer and eliminates the "extra" atoms originally included in the molecular precursor.

In ALD applications, typically two molecular precursors are introduced into the ALD reactor in separate stages. For example, a metal precursor molecule, $ML_x$, comprises a metal element, M (e.g., M=Al, W, Ta, Si, etc.), that is bonded to atomic or molecular ligands, L. The metal precursor reacts with the substrate. This ALD reaction occurs only if the substrate surface is prepared to react directly with the molecular precursor. For example, the substrate surface typically is prepared to include hydrogen-containing ligands, AH, that are reactive with the metal precursor. The gaseous precursor molecule effectively reacts with all the ligands on the substrate surface, resulting in deposition of an atomic layer of the metal: substrate-AH+$ML_x$→substrate-$AML_{x-1}$+HL, where HL is a reaction by-product. During the reaction, the initial surface ligands, AH, are consumed, and the surface becomes covered with L ligands, which cannot further react with metal precursor $ML_x$. Therefore, the reaction self-terminates when all the initial AH ligands on the surface are replaced with $AML_{x-1}$ species.

The reaction stage is typically followed by an inert-gas purge stage that eliminates the metal precursor from the chamber prior to the separate introduction of the other precursor.

A second molecular precursor then is used to restore the surface reactivity of the substrate towards the metal precursor. This is done, for example, by removing the L ligands and redepositing AH ligands. In this case, the second precursor typically comprises the desired (usually nonmetallic) element A (i.e., O, N, S), and hydrogen (i.e., $H_2O$, $NH_3$, $H_2S$). The reaction, substrate-ML+$AH_y$→substrate-M–AH+HL, (here, for the sake of simplicity, the chemical reactions are not balanced) converts the surface back to being AH-covered. The desired additional element, A, is incorporated into the film and the undesired ligands, L, are eliminated as volatile by-product. Once again, the reaction consumes the reactive sites (this time, the L terminated sites) and self-terminates when the reactive sites on the substrate are entirely depleted. The second molecular precursor then is removed from the deposition chamber by flowing inert purge-gas in a second purge stage.

This sequence of surface reactions and precursor-removal that restores the substrate surface to its initial reactive state is a typical ALD deposition cycle. Restoration of the substrate to its initial condition is a key aspect of ALD. It implies that films can be layered down in equal metered sequences that are all identical in chemical kinetics, deposition per cycle, composition, and thickness. Self-saturating surface reactions make ALD insensitive to transport nonuniformity. This transport nonuniformity may pertain either to the engineering and the limitations of the flow system or could be related to surface topography (i.e., deposition into three dimensional, high aspect ratio structures). Nonuniform flux of chemicals can only result in different completion times at different areas. However, if each of the reactions is allowed to complete on the entire substrate surface, the different completion kinetics bear no penalty. This is because the areas that are first to complete the reaction self-terminate the reaction, while the rest of the area on the surface is able to complete the reaction and self-terminate and essentially catch up.

Efficient practice of ALD requires an apparatus capable of changing the flux of chemicals from $ML_x$ to $AH_y$ abruptly and fast. Furthermore, the apparatus must be able to carry this sequencing efficiently and reliably for many cycles to facilitate cost-effective coating of many substrates. Typically, an ALD process deposits about 0.1 nm of a film per ALD cycle.

A useful and economically feasible cycle time must accommodate a thickness in a range of about from 3 nm to 30 nm for most semiconductor applications, and even thicker films for other applications. Industry throughput standards dictate that substrates be processed in 2 minutes to 3 minutes, which means that ALD cycle times must be in a range of about from 0.6 seconds to 6 seconds. Multiple technical challenges have so far prevented cost-effective implementation of ALD systems and methods for manufacturing of semiconductor devices and other devices.

Generally, an ALD process requires alternating in sequence the flux of chemicals to the substrate. A representative ALD process, as discussed above, requires four different operational stages:

1. $ML_x$ reaction;
2. $ML_x$ purge;
3. $AH_y$ reaction; and
4. $AH_y$ purge.

Given the need for short cycle times, chemical delivery systems suitable for use in ALD must be able to alternate incoming molecular precursor flows and purges with subsecond response times. Also, if significant flow nonuniformities exist, these can be overcome through the self-terminating nature of the chemical reactions by increasing the reaction-stage time to the time dictated by areas that are exposed to the smallest flux. Nevertheless, this necessarily degrades throughput since cycle times increase correspondingly.

In order to minimize the time that an ALD reaction needs to reach self-termination, at any given reaction temperature, the flux of chemicals into the ALD reactor must be maximized. In order to maximize the flux of chemicals into the ALD reactor, it is advantageous to introduce the molecular precursors into the ALD reactor with minimum dilution of inert gas and at high pressures. On the other hand, the need to achieve short cycle times requires the rapid removal of these molecular precursors from the ALD reactor. Rapid removal in turn dictates that gas residence time in the ALD reactor be minimized. Gas residence times, $\tau$, are proportional to the volume of the reactor, V, the pressure, P, in the ALD reactor, and the inverse of the flow, Q, $\tau=VP/Q$. Accordingly, lowering pressure (P) in the ALD reactor facilitates low gas residence times and increases the speed of removal (purge) of chemical precursor from the ALD reactor. In contrast, minimizing the ALD reaction time requires maximizing the flux of chemical precursors into the ALD reactor through the use of a high pressure within the ALD reactor. In addition, both gas residence time and chemical usage efficiency are inversely proportional to the flow. Thus, while lowering flow will increase efficiency, it will also increase gas residence time.

Existing ALD apparatuses have struggled with the trade-off between the need to shorten reaction times and improve chemical utilization efficiency, and on the other hand, the need to minimize purge-gas residence and chemical removal times. Certain ALD systems of the prior art contain chemical delivery manifolds using synchronized actuation of multiple valves. In such systems, satisfactory elimination of flow excursions is impossible because valve actuation with perfect synchronization is itself practically impossible. As a result, the inevitable flow excursions are notorious for generating backflow of gas that leads to adverse chemical mixing.

Thus, a need exists for an ALD apparatus that can achieve short reaction times and good chemical utilization efficiency, and that can minimize purge-gas residence and chemical removal times, while preventing backflow.

As a conventional ALD apparatus is utilized, "memory" effects tend to reduce the efficiency of the ALD reactor. Such memory effects are caused by the tendency of chemicals to adsorb on the walls of the ALD reactor and consequentially release from the walls of the ALD reactor on a time scale that is dictated by the adsorption energy and the temperature of the walls. This phenomenon tends to increase the residence time of trace amounts of chemicals in the ALD reactor. As a result, memory effects tend to increase the purge-time required for removal of chemicals. Thus, a need exists for an ALD apparatus that minimizes memory effects.

Films grow on all areas of conventional ALD apparatuses that are exposed to the chemicals. In particular, film growth occurs on exposed chamber walls, as well as on the substrate. Film growth on chamber walls deteriorates performance of the ALD apparatus to the extent that the growth of film produces an increased surface area on the walls of the ALD chamber. The propensity of films to grow on the chamber walls scales with the surface area of the chamber walls. Likewise, increased surface area further extends chamber memory effects. An increase in surface area may result from the growth of inferior porous film deposits. Film growth that results in porous deposits can extend chamber memory by entrapments of chemical molecules inside the pores. Thus, it is essential to the functioning of an ALD apparatus that growth of films and deposits is kept to a minimum, and that any film growth that does occur is controlled to deposit high quality films that effectively cover the walls without an increase of surface area or the growth of porosity. Thus, a further need exists for an ALD apparatus that minimizes film growth and provides for the control of any film growth that is allowed to occur.

A well optimized ALD apparatus and method is designed to maintain adequate minimal coexistence of ALD precursors in the reaction space in which ALD deposition on a substrate occurs. In contrast, adverse coexistence of ALD precursors is practically inevitable in the system space downstream from the ALD reaction space, provided that throughput is not significantly compromised. The adverse coexistence could only be avoided by purging a substantially larger volume, thereby significantly sacrificing throughput of the ALD system. Typically, ALD precursors coexisting in a chamber space tend to produce inferior films. As a result, throughput-optimized ALD systems suffer from the tendency to grow inferior solid deposits in the space immediately downstream from the ALD space. Inferior film growth becomes increasingly worse because the inferior films present increased surface area, which enhances precursor coexistence, thereby aggravating the problem. Since some of the chemicals proximately downstream from the ALD space return back into the ALD reaction space (e.g., by diffusion), ALD performance deteriorates. In addition, inferior deposition of particles on the substrate results. Accordingly, conventional ALD systems operated at peak throughput are doomed to rapid buildup of contamination and rapid degradation of ALD performance.

Since throughput-optimized ALD systems are characterized by precursor-coexistence immediately downstream from the ALD reaction space, maintaining these systems at peak performance over long and cost-effective maintenance cycles dictates that the unavoidable downstream deposition of films be actively controlled for adequate quality and preferred location. Localized precursor abatement downstream from the ALD space would also substantially reduce wear of downstream components such as pumps, valves, and gauges.

Cold and hot traps have been extensively used to remove undesired constituents from downstream effluents, in the sub-atmospheric pressure range, and are well known to those who are skilled in the art. Other techniques have also been effective for this purpose, such as plasma abatement apparatuses and residence-time extending traps. Many of these abatement solutions are available in the commercial market as "turnkey" equipment that can be adapted for effective use on a variety of different systems. Typically, these abatement apparatuses implement sacrificial abatement surfaces for effectively trapping reactive constituents either permanently (e.g., by chemical reaction to deposit solid films) or temporarily. A majority of these traps can be adapted, in principle, into the downstream of ALD systems. However, considerations of safety and the need to seamlessly integrate abatement into an optimized ALD system considerably restrict the practical feasibility and cost effectiveness of most abatement techniques.

In principle, safety concerns prohibit chemical abatement of ALD precursors by a cold trap. Implementation of hot traps to facilitate reaction between the ALD precursors requires a considerate design and control of conditions to prevent growth of inferior films. Certain properties of typical ALD precursor combinations make the design of hot trap process conditions specific and difficult to control; for example, the precursors TMA and $H_2O$ that are used to deposit $Al_2O_3$ ALD films. Since abatement under ALD conditions bears an unacceptable throughput penalty, coexistence of the reactants in the abatement space is a given. Accordingly, it is difficult to avoid growth of inferior $Al(OH)_3$ deposits. Suppression of $Al(OH)_3$ growth to promote growth of high quality $Al_2O_3$ deposits require that $H_2O$ levels are kept at a very low level. This task is not trivial since the low reactivity of $H_2O$ dictates dosage of excessive amounts in a high throughput process. Temperature elevation is limited to below 350° C. to avoid TMA pyrolysis. TMA pyrolysis promotes growth of carbonized and rather inferior alumina deposits.

Likewise, close inspection of other ALD precursor systems reveal that typically $AH_y$-type precursors must be excessively dosed, thereby creating problematic inferior deposits such as oxychlorides and amine salts. Accordingly, it is a typical observation that, unfortunately, ALD precursor combinations can deposit exceptional quality ALD films but, if allowed to react under CVD conditions, under typical exhaust conditions where the concentration of $AH_y$ precursor is high, create inferior films. In general, the quality of the CVD deposits improve by elevating the temperature and by maintaining the concentration of $AH_y$ precursors at very low levels.

A generalized ALD abatement solution should be suitable for many different types of ALD processes. U.S. Patent Application Publication 2002/0187084 describes a method for removing substances in gases discharged from an ALD reaction process that involves directing excess reactant to sacrificial material maintained at substantially the same reaction conditions as at the substrate. However, if optimal ALD throughput is not to be compromised, conditions in the abatement space must, by definition, deviate from conditions in the ALD space. In particular, while the ALD space is optimized to grow high-quality ALD films, coexistence of ALD precursors in the abatement space could promote deposition of inferior films. Practical capacity of abatement surfaces dictate that either the abatement surface is made of very high porosity element or the abatement volume made of very large volume. Either way, the resulting abatement space will tend to accumulate the non-solid producing ALD precursors, since these precursors are always used in large excess in throughput-optimized ALD processes. For example, $H_2O$ precursor used in an ALD process to deposit $Al_2O_3$ from TMA and $H_2O$ could accumulate in the abatement space to a substantially high partial pressure, promoting deposition of inferior films. This potential accumulation of $H_2O$ would be aggravated if the deposition of inferior films became excessive, and diffusion of accumulated $H_2O$ back into the reaction space could lead to deteriorated ALD performance. Accordingly, hot traps, such as the one described in U.S. Application Publication 2002/0187084, are not a good choice for ALD abatement unless means are provided to control accumulation of ALD precursors, typically the ones that must be excessively used. It is also essential for a generic abatement solution to provide generic means of abatement capable of generating quality film deposition under a variety of conditions.

In existing CVD, PECVD, and ALD systems, gas entrapment and gas-flow disturbances in a reaction chamber, and resulting gas-flow and gas-pressure nonuniformities at the substrate surface, commonly cause adverse nonuniformities in the thickness and other characteristics of the deposited thin film. In ALD, gas-flow and gas-pressure nonuniformities during chemical dosage do not necessarily cause film nonuniformities, provided that appropriately long dosage times are implemented. However, gas entrapment and gas-flow disturbances often severely and adversely impact the effectiveness of purge steps. For example, the "dead-leg" space associated with the wafer transport channel in the wall of a single wafer processing chamber is a known problem in the art of wafer processing such as CVD, etch, ALD and PVD. In particular, effective ALD purge of this space typically is impossible. The art of single wafer deposition has produced a variety of effective remedies for this problem. For example, U.S. Pat. No. 5,558,717 issued Sep. 24, 1996 to Zhao et al. teaches the advantageous implementation of an annular flow orifice and an annular pumping channel. This annular design requires a relatively wide process-chamber design. In another example, U.S. Pat. No. 6,174,377 issued Jan. 16, 2001 to Doering et al. describes an ALD chamber designed for wafer loading at a low chuck position, while wafer processing is carried out at a high chuck position, leaving the wafer transport channel, and the flow disturbances associated with it, substantially below the wafer level. Both of these prior art solutions and other prior art solutions are not well-suited to resolve the problems associated with substrate transport mechanisms in ALD systems.

Thus, a need exists in chemical deposition processes, particularly in ALD technology, for an apparatus that provides uniform and symmetrical flux of chemicals to substrate surfaces, and provides smooth flow-path structures without dead leg wafer loading cavities.

SUMMARY OF THE INVENTION

Embodiments in accordance with the invention helped solve some of the problems described above. Systems, apparatuses, and methods in accordance with the invention provide Synchronous Modulation of Flow and Draw ("SMFD") in chemical processes, and particularly in atomic layer deposition processes and systems.

Atomic layer deposition ("ALD") is preferably practiced with the highest possible flow rate through the deposition chamber during purge, and with the lowest possible flow rate during dosage of chemicals. Accordingly, an ALD system in accordance with the invention generates and accommodates significant modulation of flow rates during ALD cycles. The flow of process gas (either inert purge gas or chemical reactant gas) into a process chamber (or ALD chamber or deposition chamber) is referred to herein as "flow"; the flow of gas out of a process chamber is referred to herein as "draw". Under steady-state conditions, the draw generally matches the flow. During transient flow conditions, the flow and the draw are "mismatched".

An important aspect of an embodiment in accordance with the invention is that it resolves the trade-off of conventional ALD systems between the contradictory requirements of a high flow rate during a purge of the deposition chamber, and of a low flow rate during chemical dosage. SMFD in accordance with the invention provides the ability to purge a process chamber at a low-pressure and a high purge-gas flow rate, and sequentially to conduct chemical dosage in the process chamber at a high-pressure and a low flow rate of chemical reactant gas, and to modulate pressures and gas flow rates with fast response times.

In one aspect, a method in accordance with the invention comprises a cycle of conducting a first chemical dosage stage, the first chemical dosage stage comprising flowing a first chemical reactant gas through a deposition chamber at a selected first-dosage flow rate and at an independently selected first-dosage pressure; secondly, conducting a first purge stage by flowing a first purge gas through the deposition chamber at a selected first purge flow rate and at an independently selected first purge pressure; thirdly, conducting a second chemical dosage stage, the second chemical dosage stage comprising flowing a second chemical reactant gas through the deposition chamber at a selected second-dosage flow rate and at an independently selected second-dosage pressure; and fourthly, conducting a second purge stage by flowing a second purge gas through the deposition chamber at a selected second purge flow rate and at an independently selected second purge pressure. Typically, the first purge gas and second purge gas are the same and are supplied by a common purge gas source. An inherent characteristic of methods in accordance with the invention is that the first chemical dosage stage, the first purge stage, the second dosage stage, and the second purge stage are each conducted for a selected, controlled time period, which remains the same in each repetition of the cycle. A typical four-stage cycle is commonly repeated scores or hundreds of times to deposit a single thin film in an ALD process. An important benefit of embodiments in accordance with the invention is that the duration of each stage of a cycle, and consequently the total time duration of a cycle, is typically much shorter than the times that are practically feasible in conventional ALD processes and systems. Thus, conducting the first chemical dosage stage, the first purge stage, the second chemical dosage stage, and the second purge stage in sequence typically comprises conducting the sequence in less than 3 seconds, preferably less than one second, and more preferably less than 0.5 second. For example, excellent ALD thin films of $Al_2O_3$ have been produced by a method in accordance with the invention in which the cycle time was only 450 milliseconds ("msec"). To maximize throughput while maintaining good thin film quality, the time duration of each of the four stages is typically different from that of the other stages. Also, the flow rate of each of the stages is typically different from that of the other stages in the cycle. Generally, the first purge flow rate is greater than the first dosage flow rate, the ratio of the first purge flow rate to the first dosage flow rate typically exceeding 1.5, usually exceeding 20, and preferably exceeding 100. Similarly, the second purge flow rate is generally greater than the second dosage flow rate, the ratio of the second purge flow rate to the second dosage flow rate typically exceeding 1.5, usually exceeding 20, and preferably exceeding 100.

In another aspect, initiating the first chemical dosage stage includes initially flowing the first chemical reactant gas at a first transient flow rate, the first transient flow rate being initially substantially greater than the first-dosage flow rate. In still another aspect, initiating the second chemical dosage stage includes initially flowing the second chemical reactant gas at a second transient flow rate, the second transient flow rate being initially substantially greater than the second-dosage flow rate.

In another aspect, flowing a first chemical reactant gas at a selected first-dosage flow rate and at an independently selected first-dosage pressure comprises controlling the first-dosage flow rate of the first chemical reactant gas into the deposition chamber and independently substantially matching a first-chemical draw of the first chemical reactant gas out of the deposition chamber to the first-dosage flow rate. In another aspect, independently substantially matching the first-chemical draw of the first chemical reactant gas out of the deposition chamber comprises controlling a first-dosage draw pressure downstream from the deposition chamber. In another aspect, controlling the first-dosage draw pressure comprises flowing draw gas at a first-dosage draw-gas flow rate through a draw control chamber and controlling the first-dosage draw-gas flow rate to achieve the first-dosage draw pressure, the draw control chamber being located downstream from the deposition chamber.

In another aspect, flowing the first purge gas through the deposition chamber at the selected first purge flow rate and at the independently selected first purge pressure comprises controlling the first purge flow rate of the first purge gas into the deposition chamber and independently substantially matching a first purge-draw of the first purge gas out of the deposition chamber to the first purge flow rate. In another aspect, independently substantially matching the first purge-draw of the first purge gas out of the deposition chamber comprises controlling a first purge-draw pressure downstream from the deposition chamber. In another aspect, controlling the first purge-draw pressure comprises flowing draw gas at a first-purge draw-gas flow rate through the draw control chamber and controlling the first-purge draw-gas flow rate to achieve the first-purge draw pressure.

In another aspect, flowing a second chemical reactant gas at a selected second-dosage flow rate and at an independently selected second-dosage pressure comprises controlling the second-dosage flow rate of the second chemical reactant gas into the deposition chamber and independently substantially matching a second-chemical draw of the second chemical reactant gas out of the deposition chamber to the second-dosage flow rate. In another aspect, independently substantially matching the second-chemical draw of the second chemical reactant gas out of the deposition chamber comprises controlling a second-dosage draw pressure downstream from the deposition chamber. In another aspect, controlling the second-dosage draw pressure comprises flowing draw gas at a second-dosage draw-gas flow rate through the draw control chamber and controlling the second-dosage draw-gas flow rate to achieve the second-dosage draw pressure.

In another aspect, flowing the second purge gas through the deposition chamber at the selected second purge flow rate and at the independently selected second purge pressure comprises controlling the second purge flow rate of the second purge gas into the deposition chamber and independently substantially matching a second purge-draw of the second purge gas out of the deposition chamber to the second purge flow rate. In another aspect, independently substantially matching the second purge-draw of the second purge gas out of the deposition chamber comprises controlling a second purge-draw pressure downstream from the deposition chamber. In another aspect, controlling the second purge-draw pressure comprises flowing draw gas at a second-purge draw-gas flow rate through the draw control chamber and controlling the second-purge draw-gas flow rate to achieve the second-purge draw pressure, the draw control chamber being located downstream from the deposition chamber.

In another aspect, flowing a first chemical reactant gas at a selected first-dosage flow rate and at an independently selected first-dosage pressure comprises controlling the first-dosage flow rate of the first chemical reactant gas into the deposition chamber, and independently intentionally generating a mismatch between the first-dosage flow rate and a first-chemical draw of the first chemical reactant gas out of the deposition chamber by controlling a draw pressure downstream from the deposition chamber, so that the first-dosage pressure in the deposition chamber substantially changes during a pressure-transition period to reduce substantially the mismatch, thereby substantially matching the first-chemical draw to the first-dosage flow rate.

In another aspect, flowing a second chemical reactant gas at a selected second-dosage flow rate and at an independently selected second-dosage pressure comprises controlling the second-dosage flow rate of the second chemical reactant gas into the deposition chamber, and independently intentionally generating a mismatch between the second-dosage flow rate and a second-chemical draw of the second chemical reactant gas out of the deposition chamber by controlling a draw pressure downstream from the deposition chamber, so that the second-dosage pressure in the deposition chamber substantially changes during a pressure-transition period to reduce substantially the mismatch, thereby substantially matching the second-chemical draw to the second-dosage flow rate.

In another aspect, flowing the first chemical reactant gas through the deposition chamber comprises providing a first reactant-gas source having a known first-source pressure, and flowing first chemical reactant gas from the first reactant-gas source through a first-source flow restriction element ("FRE") into the deposition chamber.

In another aspect, flowing the second chemical reactant gas through the deposition chamber comprises providing a second reactant-gas source having a known second-source pressure, and flowing second chemical reactant gas from the second reactant-gas source through a second-source FRE into the deposition chamber.

In still another aspect, a method in accordance with the invention preferably also includes filling a first booster chamber with the first chemical reactant gas at substantially the known first-source pressure during a time period not including the first chemical dosage stage, the first booster chamber being located downstream from the first-source FRE and upstream from the deposition chamber and subsequently initiating the first chemical dosage stage by opening a first chemical shut-off valve, the first chemical shut-off valve being in serial fluidic communication between the first booster chamber and the deposition chamber, thereby initially flowing the first chemical reactant gas at a first transient flow rate, the first transient flow rate being initially substantially greater than the first-dosage flow rate.

In still another aspect, a method in accordance with the invention preferably also includes filling a second booster chamber with the second chemical reactant gas at substantially the known second-source pressure during a time period not including the second chemical dosage stage, the second booster chamber being located downstream from the second-source FRE and upstream from the deposition chamber, and initiating the second chemical dosage stage by opening a second chemical shut-off valve, the second chemical shut-off valve being in serial fluidic communication between the second booster chamber and the deposition chamber, thereby initially flowing the second chemical reactant gas at a second transient flow rate, the second transient flow rate being initially substantially greater than the second-dosage flow rate.

In one aspect, an apparatus in accordance with the invention is able to modulate synchronously flow, draw, and pressure of gas in a process chamber. The word "synchronously" here means in rapid controlled succession, with fast response times and with minimal uncontrolled excursions of pressure or gas flow rate. A system in accordance with the invention includes an apparatus capable of modulating a flow of gas into a process chamber ("PC"), and substantially concurrently and independently matching a draw of the gas out of the process chamber to the flow to sustain a substantially steady pressure throughout the deposition while substantially modulating the flow and residence time of gas in the PC. Accommodating large flow modulations enables independent optimization of purge and dosage stages and is an important benefit of SMFD implementation. Nevertheless, in certain embodiments, some limited intentional pressure modulation, in particular a desired pressure increase during chemical dosage, is implemented, in addition to the flow modulation. Such pressure modulations are achieved if draw modulation, synchronously with flow modulation, is provided with some predetermined mismatch. This mismatch, which does not generate backflow in well-designed SMFD apparatuses and methods, causes the pressure in the PC to change during the pressure-transition period to reach flow-draw match, effecting thereby a synchronous pressure modulation.

In another aspect, an apparatus includes a process chamber, a process-gas conduit connected to the process chamber for controlling a flow rate of gas into the process chamber, a draw control chamber ("DC") configured for a flow of draw gas, a process-chamber flow restriction element ("FRE") in serial fluidic communication between the process chamber and the draw control chamber, a draw exhaust line in serial fluidic communication with the draw control chamber, and a draw-control FRE in serial fluidic communication with the draw exhaust line. Generally, an FRE is designed to provide a certain conductance (or inversely, resistance) in a gas flow path. In another aspect, a system further includes a draw-source shut-off valve to control a flow of draw-gas through the draw control chamber. In still another aspect, a system includes a draw-source-FRE in serial fluidic communication with the draw-source shut-off valve and the draw control chamber. In another aspect, a system further includes a plurality of process-gas shut-off valves in serial fluidic communication with the process-gas conduit, each shut-off valve being configured to control the inflow of a process gas into the process chamber. In another aspect, one of the process-gas shut-off valves comprises a purge-source shut-off valve in serial fluidic communication with the process chamber for controlling the flow of a purge gas to the process chamber. In another aspect, a system further includes a purge-source FRE in serial fluidic communication with the purge-source shut-off valve. In another aspect, a system further includes a plurality of process-gas FREs, each process-gas FRE being in serial fluidic communication with one of the process-gas shut-off valves. In another aspect, a system further includes a plurality of booster chambers, each booster chamber being in serial fluidic communication with the process-gas conduit, each booster chamber being located upstream from one of the process-gas shut-off valves and downstream from one of the process-gas FREs. In another aspect, a system further includes a plurality of booster FREs, each booster FRE being downstream from one of the booster chambers. In another aspect, a system further includes a gas distribution chamber in serial fluidic communication between the process-gas shut-off valves and the process chamber, and in serial fluidic communication between the purge-source shut-off valve and the process chamber, and a gas-distribution FRE in serial fluidic communication between the gas distribution chamber and the process chamber. In still another aspect, the gas-distribution FRE comprises a nozzle array. In another aspect, the nozzle array comprises a plurality of nozzles having aspect ratios not less than 1.5.

In another aspect, a system further includes a purge exhaust line in serial fluidic communication with the gas distribution chamber, and a purge-exhaust shut-off valve, the purge-exhaust shut-off valve being in serial fluidic communication between the gas distribution chamber and the purge-exhaust line. In another aspect, a system further includes a purge-exhaust FRE in serial fluidic communication with the purge-exhaust shut-off valve. In another aspect, some of the process-gas shut-off valves comprise a multi-way valve having a plurality of non-common ports and a plurality of common ports, each of the non-common ports being in serial fluidic communication with a process-gas source, a plurality of common ports being in serial fluidic communication with the process chamber, and at least one common port being in serial fluidic communication with the purge-source shut-off valve.

In some preferred embodiments, an apparatus further includes a draw-gas introduction chamber ("DGIC"), the DGIC being in serial fluidic communication between the process chamber and the draw control chamber, a draw-source shut-off valve to control a flow of draw-gas into the DGIC, a process-chamber FRE located between the process chamber and the DGIC, and a DGIC-FRE located between the DGIC and the draw control chamber. In another aspect, a system further includes a draw-source-FRE located in serial fluidic communication with the draw-source shut-off valve and the DGIC.

In another aspect, a system further includes an abatement surface located in the draw control chamber. In still another aspect, a system further includes a reactive gas inlet for introducing reactive gas into the draw control chamber to enhance chemical abatement. In another aspect, the reactive gas inlet comprises a reactive gas plenum proximate to the draw control chamber. In another aspect, a system further includes an abatement chamber, the abatement chamber located downstream from the draw control chamber.

In another aspect, a system further includes a pressure control chamber located downstream from the draw control chamber and in serial fluidic communication with the draw control chamber and the draw exhaust line. In another aspect, the process chamber is an atomic layer deposition chamber ("ALDC").

In another aspect, a system in accordance with the invention includes a reactor vessel having a reactor-vessel wall and a vessel interior wherein the deposition chamber, the DGIC, and the draw control chamber are enclosed in the vessel interior.

In another aspect, a system in accordance with the invention includes a reactor vessel containing a perimeter slot valve ("PSV"), whereby the perimeter slot valve includes a substrate-transport slot through the reactor-vessel wall, a continuous perimeter cavity within the reactor-vessel wall, a continuous perimeter-sealing poppet, and an actuator for moving the sealing poppet between an open position and a closed position, wherein the sealing poppet is moved into the perimeter cavity in the closed position, the sealing poppet is moved out of the perimeter cavity in the open position, the substrate-transport slot is substantially coplanar with a substrate-supporting surface of a substrate holder, the perimeter cavity is substantially coplanar with the substrate-transport slot, the substrate-transport slot defines a substrate-transport channel through the reactor-vessel wall to the substrate holder when the sealing poppet is in the open position, and the sealing poppet separates the substrate-transport slot from the vessel interior when the sealing poppet is in the closed position.

In some embodiments, pressure in the process chamber (or ALD chamber) is maintained substantially constant during synchronous flow-draw modulation. In other embodiments in accordance with the invention, throughput and material utilization are further improved by conducting one or more chemical-dosage stages at higher pressures. For example, in some embodiments, the pressure during purge is maintained in a range of about from 30 mTorr to 100 mTorr, while ALD-pressure during chemical dosage is maintained in a range from 200 mTorr to 1000 mTorr.

In another aspect, embodiments in accordance with the invention control pressure in a process chamber by flowing a process gas into a process chamber and flowing a draw-control gas into a draw control chamber in serial fluidic communication with said process chamber and downstream from the process chamber, thereby controlling a draw pressure downstream from the process chamber. In another aspect, flowing a draw-control gas into the draw control chamber comprises flowing a reactive gas to promote chemical abatement in the draw control chamber. In another aspect, draw pressure is controlled at less than 1 atm pressure, and typically at less than 5 Torr.

BRIEF DESCRIPTION OF THE DRAWINGS

A more complete understanding of the invention may be obtained by reference to the drawings, in which.

DETAILED DESCRIPTION OF THE PREFERRED EMBODIMENT

Figure 1:
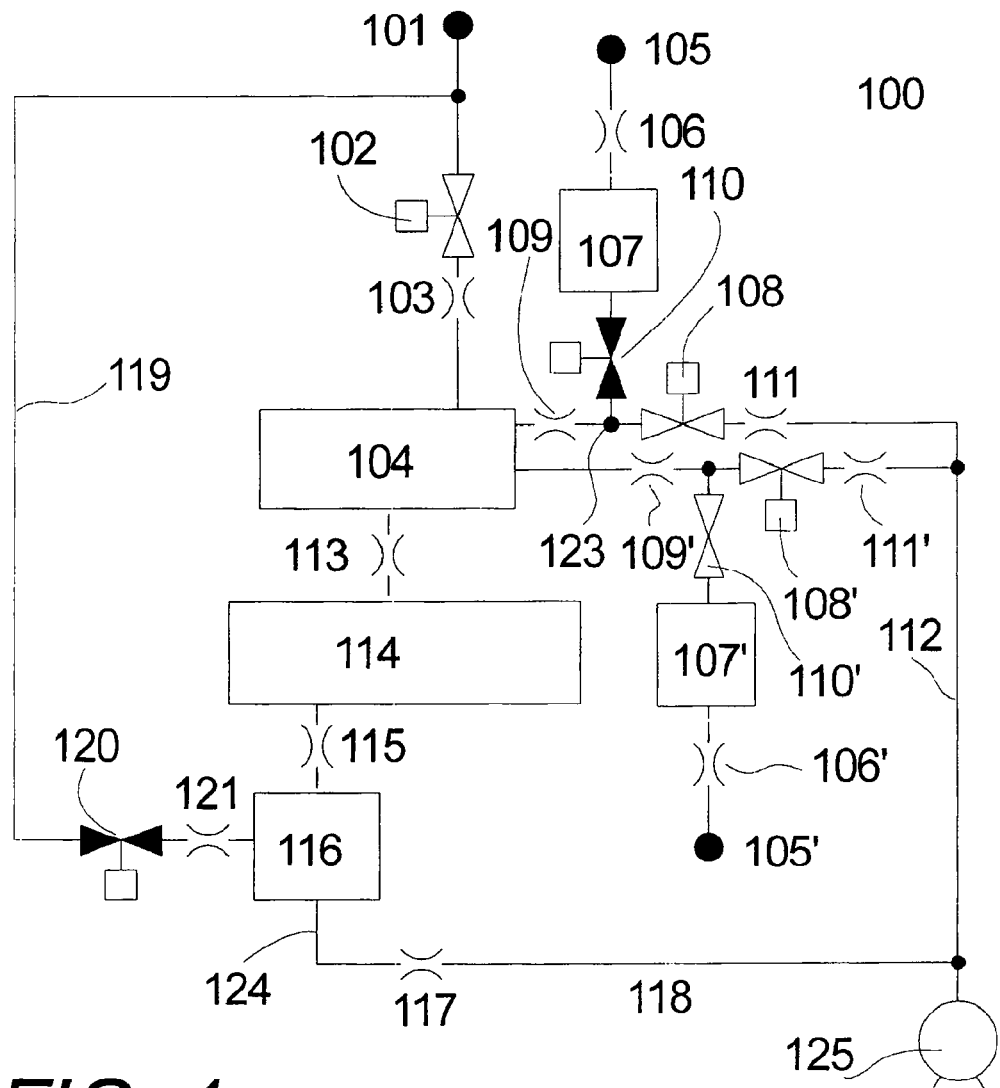
FIG. 1 depicts a flow diagram of a basic embodiment of a Synchronously Modulated Flow Draw ("SMFD") ALD system in accordance with the invention.

The invention is described herein with reference to FIGS. 1-17. For the sake of clarity, the same reference numerals are used in several figures to refer to similar or identical components. It should be understood that the structures and systems depicted in schematic form in FIGS. 1-17 serve explanatory purposes and are not precise depictions of actual structures and systems in accordance with the invention. Furthermore, the embodiments described herein are exemplary and are not intended to limit the scope of the invention, which is defined in the claims below. Embodiments in accordance with the invention are described below with reference mainly to systems and methods for ALD deposition onto a single 200 mm wafer substrate. It is understood that the invention is useful on larger or smaller scales, and that the dimensions and operating variables discussed below can be scaled up or down appropriately.

Atomic layer deposition ("ALD") is preferably practiced with the highest possible flow rate through the deposition chamber during purge, and with the lowest possible flow rate during dosage of chemicals. Accordingly, an efficient ALD system is able to generate and accommodate significant modulation of flow rates. Under steady-state conditions, the flow of process gas (either inert purge gas or chemical reactant gas) into a chamber, referred to herein as "flow", matches the flow of gas out of a chamber, referred to herein as "draw".

To accommodate significant flow modulations, a system in accordance with the invention is capable of substantially matching the flow and the draw. For example, a representative ALD cycle includes a sequence of chemical A dosage, A purge, chemical B dosage, and B purge at gas flow rates of 10 sccm, 1000 sccm, 5 sccm, and 1000 sccm, respectively. Process pressure is maintained substantially steady if the draw is controlled to modulate synchronously at substantially the same flow rate.

When modulations of the draw do not substantially match flow modulations, the system does not maintain process pressure. Instead, the system inevitably transients to a substantially different pressure that causes the flow and draw to match.

Flow into a deposition or other type of process chamber is generally controlled using an upstream manifold, substantially independent of process pressure. Draw is generally determined by the conductance of the process chamber outlet, $C_{PC}$, and by the pressure differential across that outlet, $\Delta P = P_{PC} - P_{Draw}$. Accordingly, draw=$C_{PC}\Delta P$. Generally, draw modulations can be achieved by modulating either the conductance, $C_{PC}$, or the pressure differential, $\Delta P$, or both. Modulating conductance out of process chambers is commonly used in the art of process flow systems, such as CVD, PVD, and etch systems, using mechanical devices named throttle-valves. While throttle valves have been adequately used to control steady-state pressure in those systems, they are currently too slow to accommodate the fast response times required in SMFD systems. In addition, throttle valves cause undesirable flow disturbance and generate particles. To circumvent flow distortion and particle generation problems, throttle valves are typically conventionally utilized at a downstream location that is significantly remote from the process zone. A preferred ALD system design, however, minimizes ALD deposition chamber volume, compelling location of draw control proximate to the substrate. Other means to modulate conductance, such as changing the temperature of the process outlet, are rather limited in range and very slow. Finally, draw modulation may be achieved by modulating the pumping speed of a vacuum pump. Significant pumping speed modulation, however, responds slowly and also significantly wears the pump if attempted at desired ALD switching rates.

Best suited for modulation of draw in accordance with the invention, therefore, is $\Delta P$ modulation. Modulation of $\Delta P$ while maintaining process-chamber pressure, $P_{PC}$, substantially constant is practiced in accordance with the invention by modulating $P_{Draw}$. For example, a draw control chamber (DC) is located downstream from the process chamber, and the draw control chamber has an outlet with conductance $C_{Draw}$. By flowing control gas into and through the draw control chamber, $P_{Draw}$ can be controlled independently of the pressure, $P_{PC}$, in the process, or deposition, chamber upstream. The flow of gas into the draw control chamber is the total of the draw from the process chamber and the directly inserted draw-gas flow. Since the draw is a function of $\Delta P$, independent control of $\Delta P$ provides substantial matching of draw to flow independent of the flow. Since, in principle, draw chambers can be made very small, modulation of $\Delta P$ in certain embodiments is practiced with sub-millisecond speed. Certain embodiments of the invention are advantageously implemented with a small-volume DC chamber to facilitate process conditions with short transient times. Other embodiments advantageously sacrifice draw-control speed to provide substantially larger draw control chambers. Draw control chambers with several liters of volume are useful for trapping or abatement of chemicals. As a result, the draw-control response time is in the 10 msec-20 msec range in a typical 200 mm wafer deposition system, but with the benefit of about 3 liters of usable draw control chamber space. While this "slower" draw response time typically generates pressure variations of about 5%-15% in the deposition chamber at the end of a chemical dosage stage, simulations and actual operational results show that these pressure variations have negligible impact on ALD performance. Unavoidable process-pressure variations are related to the difference between the typically short (e.g., 2 msec-4 msec) response time of an ALD chamber at the onset of high purge flow to the longer (e.g., 10 msec-20 msec) response time of the draw chamber. In certain embodiments, both a fast responding draw chamber and a large volume abatement chamber are provided by using a small draw control chamber (e.g., 40 ml) with a separate additional abatement chamber located downstream to the draw control chamber. In this case, since the pressure drop on the draw chamber FRE is preferably large, residence times in the additional abatement chamber are kept adequately long using a large volume abatement chamber. For example, if the pressure drops by a factor of 10 over the draw-control FRE, the abatement chamber must be 10 times larger to provide similar effective abatement, typically 10 liters-50 liters instead of 1 liter-5 liters. This size comparison explains the benefit of compromising ideal SMFD performance, which is believed to be adequate in most cases, for the prospects of trapping or abating chemicals in the draw control chamber. Additionally, when draw chambers are being used for the sole purpose of draw control (meaning they are very small), care should be taken to extend the ALD purge stage to include the draw control chamber to ensure that inferior film growth cannot take place in the draw control chamber. This has negligible throughput penalty (provided that the draw chamber flow path is well-designed and the draw chamber walls are controlled to an appropriate temperature) since these chambers can be made, for the typical 200 mm wafer system, with a volume of 30 cc-70 cc and also are subjected during chemical dosage to a very small partial pressure of chemicals, since the high draw flow rates essentially act to dilute the chemicals during chemical dosage.

Response time of $\Delta P$-modulation is directly related to response time of $P_{DC}$ modulation, and depends on the DC volume, the conductance of the DC outlet and the flow.

FIG. 1 depicts a flow diagram of a basic embodiment of a Synchronously Modulated Flow Draw ("SMFD") ALD system 100 in accordance with the invention.

System 100 comprises a pressure-stabilized inert, purge-gas source 101. Purge gas is supplied through purge-source shut-off valve 102 and purge-source flow restriction element ("FRE") 103 into gas distribution chamber 104, which is commonly a conventional showerhead. As depicted in FIG. 1, purge-source shut-off valve 102 and purge-source FRE 103 provide serial fluidic communication between purge-gas source 101 and gas distribution chamber 104. In this specification, flow restriction elements (FREs) cause a pressure step-down when gas is flowing through them. A chemical reactant precursor in the form of a pure chemical gas, a vapor from a liquid or solid chemical, or mixtures of vapor or gas chemicals with inert gas is provided at well-controlled pressure at a plurality of chemical-gas sources 105, 105'. Chemical-gas source 105 is connected in serial fluidic communication with booster chamber 107 through chemical-source-FRE 106. Booster chamber 107 is connected in serial fluidic communication with gas distribution chamber (showerhead) 104 through chemical-dosage shut-off valve 110 and booster-FRE 109. Gas distribution chamber 104 is connected in serial fluidic communication to purge exhaust line 112 through booster-FRE 109, purge-exhaust shut-off valve 108, and purge-exhaust FRE 111. As depicted in FIG. 1, chemical-dosage shut-off valve 110 and purge-exhaust shut-off valve 108 each comprise a simple two-way valve in parallel branches of the gas manifold system of system 100, which branch off from junction 123.

As depicted in FIG. 1, second chemical-gas source 105' is connected to showerhead 104 and purge exhaust line 112 with devices corresponding to those described with reference to chemical-gas source 105.

Gas-distribution FRE 113 provides serial fluidic communication between gas distribution chamber 104 and atomic layer deposition chamber ("deposition chamber") 114. In a preferred embodiment, in which gas distribution chamber 104 is a showerhead device, gas-distribution FRE 113 is commonly a nozzle array 113. A nozzle array provides restricted and uniform flow from gas distribution chamber 104 to deposition chamber 114, which contains a substrate being treated. Deposition chamber 114 is connected in serial fluidic communication to draw control chamber 116 through deposition-chamber FRE 115. Draw control chamber 116 comprises a draw-control outlet 124, which is connected in serial fluid communication to vacuum pump 125 through draw-control FRE 117 and vacuum line 118. A draw-gas source 101 is connected in serial fluidic communication to draw control chamber 116 through draw-gas line 119, draw-source shut-off valve 120, and draw-source-FRE 121.

During typical ALD operation, apparatus 100 is switched essentially between two static modes, a purge mode and a chemical-dosage mode. Representative valve-settings of the two basic modes of operation are presented in Table 1.

TABLE 1

| Mode | Valve 102 | Valve 120 | Valve 110 | Valve 108 |
| --- | --- | --- | --- | --- |
| Purge | OPEN | CLOSED | CLOSED | OPEN |
| Chemical dosage | CLOSED | OPEN | OPEN | CLOSED |

For clarity, the method for operating the SMFD system is described for the case of steady pressure process. As explained in the previous section, this mode commonly produces good results for critical applications. Also, as described above, it is understood that an ALD process typically comprises a cycle having at least four distinct stages, and the cycle is repeated multiple times in sequence to deposit the desired thin film. The two modes described with reference to Table 1 and FIG. 1 are representative for a chemical-dosage stage and a purge stage of a typical four-stage cycle. In purge mode, for known purge-source pressure of purge-gas source 101, FREs 103 and 113 are designed to deliver a desired flow, $Q_{purge}$, of purge gas from purge-gas source 101 into gas distribution chamber 104; then through gas distribution chamber 104, deposition chamber 114, and draw control chamber 116 into draw-control outlet 124; and then through FRE 109 and purge-exhaust shut-off valve 108 to purge exhaust line 112, while showerhead pressure, $P_{purge}^{SH}$ and ALD deposition-chamber $P_{114}$ are maintained. In chemical dosage mode, for known pressure of chemical-gas source 105, FRE 106 and 109 are designed to deliver chemical reactant gas to gas distribution chamber (showerhead) 104 typically at a chemical-dosage flow rate, $Q_{CD}$, which is preferably substantially less than $Q_{purge}$. This lower flow is accompanied by lower showerhead pressure, $P_{CD}^{SH}$. Because the pressures in deposition chamber 114 and gas distribution chamber 104, $P_{114}$ and $P_{104}$, respectively, are much lower (typically measured in mTorr) than the pressure of chemical-gas source 105 (typically measured in units of Torr), FREs 106, 109 are typically designed so that chemical-dosage flow rate, $Q_{CD}$, is practically independent of pressures $P_{114}$ and $P_{104}$. In chemical-dosage mode, draw-gas source 101 at known draw-gas-source pressure supplies draw gas at a desired draw-gas flow rate to draw control chamber 116 through FRE 121. In accordance with the invention, the draw-gas-source pressure at source 101 and FRE 121 determine the draw-gas flow rate through draw control chamber 116. This draw-gas flow rate and FRE 117 establish chemical-dosage draw pressure in draw control chamber 116. The draw pressure increases as draw-gas flow rate increases. The difference in pressure between deposition chamber 114 and draw control chamber 116, together with the conductance of FRE 115, determine the draw of process gas, including unreacted chemical precursor, out of deposition chamber 114. The draw of process gas from deposition chamber 114 into and through draw control chamber 116 also contributes slightly to the total flow rate of gases through draw control chamber 116, and therefore to the draw pressure. An increase in the chemical-dosage draw pressure in draw control chamber 116 reduces the draw from deposition chamber 114 into and through draw control chamber 116. Conversely, a decrease in the chemical-dosage draw pressure in draw control chamber 116 increases the draw from deposition chamber 114.

In preferred embodiments in accordance with the invention, in addition to the two static modes, that is, a purge mode and a steady-state chemical dosage mode, a significant transient mode is designed into the initiation of chemical dosage. An initial transient flow rate is generated by chemical-gas flow from booster chamber 107. Given time to equilibrate when valve 110 is closed, the pressure in booster chamber 107 is equal to the pressure at chemical-gas source 105, $P_{107}^{static}=P_{105}$. When valve 110 is open, under steady-state conditions, the steady-state pressure at 107, $P_{107}^{SS}$, is smaller than $P_{105}$ due to the pressure gradient over FRE 106. When shut-off valve 110 is actuated to open, the initial pressure at booster chamber 107 transients from $P_{105}$ down to the steady-state pressure, $P_{107}^{SS}$. The flow of chemical reactant gas into gas distribution chamber 104 during chemical dosage is determined by the pressure at booster chamber 107 and the conductance of FRE 109. A pressure transient at booster chamber 107 causes a pressure transient at gas distribution chamber 104. As a result, during the pressure transient in booster chamber 107, the corresponding flow of chemically reactive gas into deposition chamber 114 conforms to an initial pulse that gradually decreases to the steady-state flow rate. Concurrently, the draw pressure in draw control chamber 116 conforms to an initial pulse that transients downward. The transient time is determined by the volume of draw control chamber 116, the draw flow rate, and the conductance of FRE 117. During the pressure transient in 116, the draw out of deposition chamber 114 follows a downward transient. Transient flow and transient draw are matched to minimize pressure-excursions in deposition chamber 114 through selective design of the conductance of each of FREs 106, 109, and 117, of the draw-control flow rate and of the volumes of booster chamber 107 and draw control chamber 116. It is an important aspect of the invention, however, that pressure excursions are internally suppressed by an SMFD system (especially when operated at steady-pressure) even when transient-time constants are not perfectly matched and various valve actuations are not perfectly synchronized. In fact, a major advantage of SMFD implementation as taught in some of the embodiments of this invention is the convenient and cost-effective insensitivity of performance to apparatus and process imperfections.

Preferably, dosage steps are designed for maximized chemical flux and minimized usage of chemicals. For an extreme example, a typical 300 cc-400 cc ALD chamber for the processing of 200 mm wafers remains practically free of chemical depletion effect at chemical dosage pressures from 200 mTorr. Accordingly, implementing a dosage of 100% chemical at 200 mTorr typically requires negligible additional flow of dosage chemical beyond the effect of the booster. Indeed, we have empirically found that the impact of additional dosage beyond the booster dosage of trimethylaluminum ("TMA") used for ALD of $Al_2O_3$ at 300° C. was less than 2% under dosage conditions of undiluted precursor at 200 mTorr. Accordingly, implementation of typical <10 sccm of TMA steady-state flow was sufficient to achieve optimized ALD performance.

Steady-state flow rates during a chemical-dosage stage are typically 1/10 to 1/100 of the purge-gas flow rate during a purge stage. The time scale to establish a steady state of chemical dosage is, therefore, unacceptably long. To avoid this throughput penalty, effective chemical dosage steps, according to embodiments of this invention, are tailored to provide an initial fast flow of chemical at the initial stage of chemical dosage steps. Accordingly, the initial flow transient serves to reduce significantly the response time of a chemical-dosage stage. This reduced response time is important for enhancing the efficiency and throughput of an ALD process. During the initial, transient part of a chemical dosage stage, the volumes of gas distribution chamber 104 and deposition chamber 114 are quickly filled by a pulse of chemical-gas at an initially high pressure and at a corresponding initially high transient flow rate. Initial transient flow rate during chemical dosage is typically adjusted to match the purge flow rate of inert purge gas flow during a preceding purge stage. Accordingly, continuity of flow is preserved. Gas distribution chamber 104 and deposition chamber 114 are quickly filled with chemical gas because the residence time of chemical gas flowing through the chambers is short, corresponding to the initially high chemical-dosage flow rate. Booster chamber volume and booster FREs are selectively designed to substantially match the draw chamber pressure increase at the initial stage of chemical dosage. Booster chamber volume is also designed to provide an integrated booster exposure on the order of 1 pressure×volume-2 pressure×volume equivalents of the ALD chamber during dosage. For example, if the deposition chamber volume is 400 cc and the dosage pressure is 200 mTorr, the booster volume is designed to provide a booster exposure of 0.08 liter×Torr-0.16 liter×Torr. When ALD system 100 is switched from a chemical-dosage mode to a purge mode, the transients are usually much less important. The relatively small volume of gas distribution chamber 104 is quickly loaded to $P_{purge}^{SH}$ through the relatively high conductance of FRE 103. When a small-volume draw control chamber is implemented, pressure drop in draw control chamber 116 from a chemical-dosage draw pressure to a purge-draw pressure is much faster than purge residence time, and the switching from dosage to purge occurs on a timescale of several msec. However, when the volume of the draw chamber is large, the response time for draw control chamber pressure drop is longer than the purge residence time in the process chamber. For example, in a typical process used for ALD on 200 mm wafers, the residence time in the process chamber is 3 msec. Draw pressure modulation between chemical dosage and purge are on the order of 10%-20% of the total draw pressure. Typically, a draw-control chamber volume of 1 liter-5 liters is convenient for integrating abatement capability into the system (see description below). Accordingly, the draw chamber pressure modulation follows a typical time constant of 10 msec-20 msec. As a result, some process chamber excursions are unavoidable at the end of a dosage step. Nevertheless, these pressure modulations resulted in no measurable performance penalty. Also, there is no reason to produce a transient intentionally, such as in the case of the initial pulse of a chemical-dosage stage. Accordingly, transient effects associated with terminating a chemical-dosage stage are minor.

As described above, an SMFD ALD system in accordance with the invention resolves the conventional trade-off between the need for high flow (and low pressure) during purge (to enable efficient and short-time purge) and the need for low flow (and high pressure) during chemical dosage (to enable fast reaction and high chemical utilization). In a steady-pressure embodiment, the system is able to maintain substantially constant process pressure while the flow rates are modulated by more than a factor of 10. In fact, process hardware and recipes in accordance with the invention have been used successfully to generate controlled modulations in flow and draw exceeding a factor of 100 at steady pressure. Alternatively, both pressure and flow can be modulated in order to gain even higher efficiencies for purge and chemical-dosage stages with virtually no trade-off effects. An apparatus and a method in accordance with the invention achieve this desired capability by modulating the draw (flow of gas out of the deposition chamber) in synchronization with modulating the flow of gas into the deposition chamber.

An advantage of systems and methods in accordance with the invention is that some of the structures and techniques of practicing the invention use commercial parts in novel combinations, allowing low-cost design and utilization of embodiments of the invention. For example, certain embodiments include a centralized, single point-supply of inert gas at a known pressure, which gas is distributed in a selectively controlled manner through flow restriction elements within the system. An example of an inert gas source is a commercially available pressure controller (e.g., the MKS 640A series) and a gas container. Another example is a simple pressure regulator. In certain embodiments in accordance with the invention, a duration of approximately 100 msec is a practical target for each of the chemical-dosage and purge stages. The gas dynamics of a corresponding system are typically designed with a goal of a system-response time of less than 5 msec. Accordingly, to avoid undesired transient conditions, pressure instabilities, and jitter (uncontrolled and non-reproducible delay) between valves 102, 120, 108, and 110, as well as in the valves associated with other chemical sources, it is preferable to use valves capable of actuating with a speed less than 5 msec. Valves 108 and 110 represent a set of valves for one chemical source. In particular embodiments represented by the diagram of FIG. 1, the ALD system includes two such valves for each chemical-gas source. ALD typically requires at least two different chemical-gas sources. Actuation speeds of 5 msec and less are faster than typical performance of UHP diaphragm pneumatic valves. Nevertheless, several types of commercial technologies are available for implementation, including UHP solenoid valves (e.g., Parker General Valve series 99, Fujikin ECV series), piezoelectric valves, electronic fuel injectors, proportional valves, and fast MFCs (e.g., Mach One of AE-EMCO).

Embodiments in accordance with the invention utilize FREs. For example, FREs can be adjustable components (e.g., metering valves, proportional valves, heated orifices, fast MFCs) or passive components (orifices, baffles, capillaries, porous media). Passive FREs typically are less expensive and more robust than adjustable FREs. Nevertheless, adjustable FREs are usually better suited for optimization adjustments. In portions of a gas flow-path not containing a shut-off valve, the required FRE-conductance is preferably designed into the conductance of the flow-path. In portions of a gas flow-path that include a shut-off valve and a FRE, a preferred design integrates the FRE with the shut-off valve. In an integrated valve-FRE, it is preferable to design the valve to have the necessary conductance when fully open. Alternatively, devices such as proportional valves and Mach One fast MFCs can be opened to the desired conductance. In the optimization of systems and methods in accordance with the invention, adjustability of FREs 103, 106, 109, 111, and 121 allows efficient and independent optimization of static purge modes, static chemical-dosage modes, and chemical-dosage transient performance.

The pressure of a chemical-gas source 105 is preferably higher than 1 Torr to be high enough for convenient usage. In addition, chemical-gas source 105 must be able to sustain pressure during a chemical-dosage stage.

The term "chamber" and related terms refer to a component having a relatively substantial enclosed volume, V, with at least one inlet and one outlet, in which within a range of useful flow rates, Q, the pressure gradient, $\Delta P$, across the chamber (e.g., between an inlet and an outlet) is substantially smaller than the average pressure, P, in the chamber. Generally, in embodiments in accordance with the invention, the ratio $\Delta P/P$ of a chamber is less than 0.1 when V is about 1000 cc and the flow, Q, through the chamber is about 1000 sccm or less. Also, in this specification, a gas has a substantial residence time inside a chamber, for which residence time is defined by $\tau = VP/Q$. Generally, in the specification, the residence time, $\tau$, in a chamber is typically 50 μsec or longer.

In contrast, the term "flow restricting element" ("FRE") refers to a component having a negligible volume and typically having only one inlet and one outlet, in which within the range of useful flow rates, Q, the pressure gradient, $\Delta P$, is relatively large compared to the average pressure, P, between the inlet and the outlet of the FRE. Generally, in a FRE in this specification, the ratio $\Delta P/P$ is greater than 0.1 when the flow, Q, through the FRE is about 1000 sccm or less. Also, in this specification, the residence time, $\tau$, of a gas in a FRE is relatively short, generally, less than 50 μsec.

Much like an electrical circuit that has basic passive elements such as resistors, capacitors, and inductors, chambers with $\Delta P = 0$ (non-FRE character) and FREs with $V = 0$ do not practically exist. Nevertheless, in an analogy to electrical circuit conventions, ALD and other fluid-flow networks containing chambers and FREs can be practically explained and designed by assigning pure component properties to basic elements.

Therefore, one skilled in the art understands the description and design of flow systems using idealized properties of chambers and FREs. For example, the term "process chamber" means that in the process space, pressure gradients are generally minimized, although it is clear that pressure gradients exist wherever there is flow in a flow system. Indeed, in certain embodiments of an SMFD in accordance with the invention, an elongated process chamber is designed to include a pressure gradient across it.

FREs are typically designed and idealized to have zero or minimum volume, although it is known to those skilled in the art that there is no practical way to implement FREs with $V = 0$. It is also understood that, unless specifically stated, processes are advantageously practiced in chambers in which $\Delta P$ is negligible. On the other hand, in some instances, a FRE having negligible V (or $\tau$) is not practical. Yet, a FRE with a significant volume is commonly used with no performance penalty. The properties of a FRE having a significant volume is practically described and designed by combining a pure chamber, V, and a pure FRE, much like the electrical description of electrical circuit elements, for example, inductors with resistance, that are described by an "equivalent circuit".

Accounting for the volume of a FRE can be included in designs by increasing a proximate chamber's "effective" volume. Accounting for the flow-restricting property of a chamber can be achieved by adding the residual conductance of the chamber to the conductance of a downstream FRE to obtain an "effective FRE" conductance, $C_{eff}$, whereby $$C_{eff} = \frac{1}{1/C_{FRE} + 1/C_{chamber}}.$$

Systems that practically have several FREs in series and parallel may be represented by effective FREs to improve description of the systems. For example, a line that contains a capillary and a valve, both being FREs, may be represented by a single effective FRE. In preferred embodiments in accordance with this invention, flow-resistance properties are designed into the construction of valves.

Figure 2:
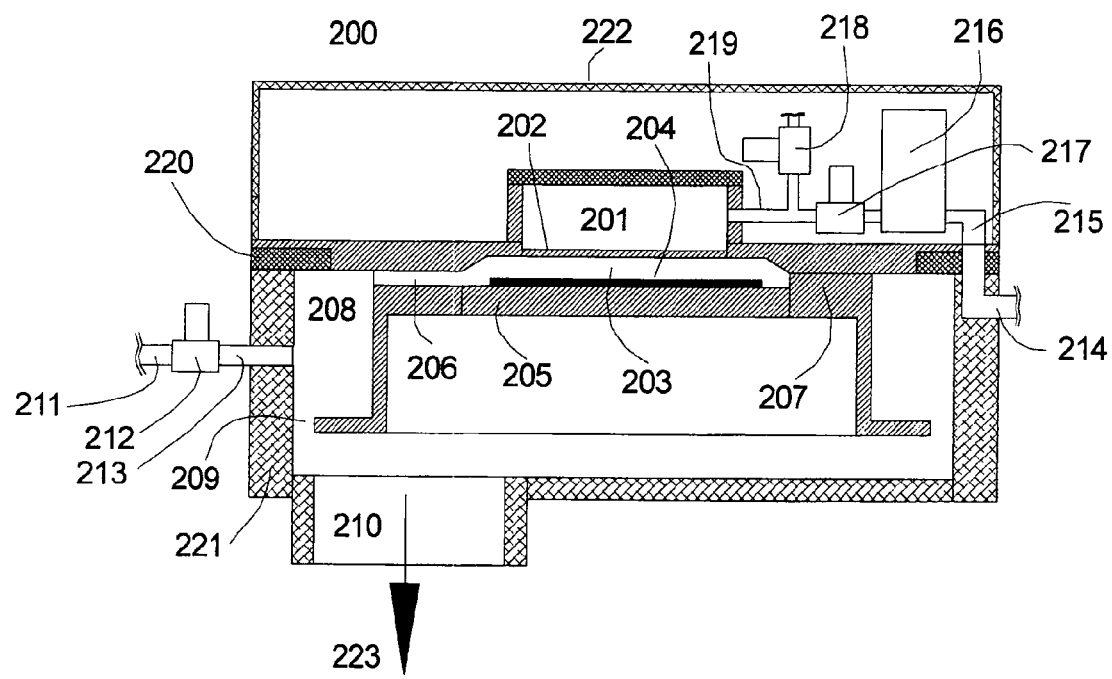
FIG. 2 depicts in schematic form a cross-sectional view of an SMFD ALD reactor vessel in accordance with the invention.

FIG. 2 depicts in schematic form a cross-sectional view of an SMFD ALD reactor vessel 200 in accordance with the invention. For clarity, several components of apparatus 200 that are standard in the art were not included in FIG. 2, such as a wafer-loading port, wafer lift pins, and electrical feedthroughs.

Gas distribution chamber (showerhead) 201 has a 100 mm internal diameter and the internal volume inside is 3 mm high. The showerhead need not cover all of the wafer-substrate surface area. Accordingly, the showerhead volume is 23.6 cm$^3$. Nozzle array (FRE) 202 separates the bottom of gas distribution chamber 201 from deposition chamber 203. A 200 mm semiconductor wafer 204 is located on heated substrate holder 205 made from a thermally conducting metal (e.g., W, Mo, Al, Ni) or other materials commonly used in the art for hot susceptors and chucks. The perimeter of the hot plate is attached with good thermal contact (or machined as one piece) to FRE 206. FRE 206 is configured as a series of radial slots. The right side of FIG. 2 depicts a portion 207 of the cross-section without a slot. During operation, gas flows from deposition chamber 203 through deposition-chamber FRE 206 into draw control chamber 208. Gas flows from draw control chamber 208 through draw-controlled FRE 209 to vacuum port 210. Draw gas flows through draw-gas line 211, draw-source shut-off valve 212, and draw-source FRE 213 into draw control chamber 208 to manage a draw pressure in draw control chamber 208. During a typical ALD operation, the flow rate of draw gas into draw control chamber 208 is selectively controlled to achieve variously a first-dosage draw pressure during a first chemical dosage stage, a purge-draw pressure during a purge stage, and a second-dosage draw pressure during a second chemical dosage stage. Normally, the flow rate of draw gas into draw control chamber 208 is increased during a chemical dosage stage relative to the flow rate during a purge stage to increase the pressure (dosage draw pressure) in draw control chamber 208, thereby decreasing the draw of process gas (including chemical reaction precursor) out of deposition chamber 203, thereby minimizing the waste of chemical and, if necessary, increasing the pressure and the flux of chemical in deposition chamber 203. During a purge stage, the flow rate of draw gas into draw control chamber 208 is typically decreased back to a lower flow rate to decrease the pressure (purge-draw pressure) in draw control chamber 208, thereby increasing the draw of purge gas out of deposition chamber 203 to accommodate higher purge gas flow-rates and, if necessary, lower purge pressures. Also depicted in FIG. 2 are a chemical-source line 214, a chemical-source FRE 215, a booster chamber 216, a chemical-dosage shut-off valve 217, a purge-exhaust shut-off valve 218, and a booster-FRE 219. Also shown is a thermal barrier 220, configured to inhibit thermal conductance between reactor-vessel walls 221 and reactor-vessel top 222. This thermal barrier is useful in embodiments in which chamber walls 221 and the showerhead (gas distribution chamber) 201 are operated at different controlled temperatures.

Both chemical utilization and chemical removal speed improve as the volume of deposition chamber 203 decreases. Substrate size, as implemented in various technologies, such as 200 mm and 300 mm round silicon wafers commonly used in semiconductor device fabrication, determine the size of a deposition chamber. For example, a deposition chamber for processing a 200 mm round wafer must have a circular area that is at least 200 mm in diameter. Gas-flow dynamics dictate that the height of this deposition chamber comprises several millimeters. Accordingly, the volume of such 200-mm deposition chamber generally comprises at least 150 cm$^3$, and more typically 300 cm$^3$ or more. Typically desired cycle times of ~0.6 second limit the maximum allowable time for chemical-removal purge stage in a range of about from 0.1 second to 0.2 second. During that time, it is generally desired that the concentration of chemical precursor reactant in a deposition chamber decreases to below 1% of its initial value. More precisely, the extent of chemical removal is dictated by the specific chemistry and the specific needs for quality of deposited films. During a purge stage of an ALD cycle, the chemical concentration in a deposition chamber is proportional to exp $(-t/\tau)$ where t is the chemical removal time. Accordingly, to achieve less than 1% levels, t needs to be equal to or longer than 4.6$\tau$. To achieve 4.6$\tau$<0.2 second, VP/Q comprises approximately 0.044 second. With V typically limited to a range greater than about 300 cm$^2$, P/Q is restricted to a range smaller than 0.145 sec/liter. For example, if Q were 500 sccm (6.33 liter Torr/sec), process pressure would be equal to or lower than 0.92 Torr. By way of continuing example, if chemical removal down to 0.0001% were needed, the pressure in the chamber during purge would be limited to a range below 300 mTorr.

In an exemplary embodiment in accordance with the invention, the showerhead (gas distribution chamber) comprises a volume of $V_{SH}$=23.6 cm$^3$. Showerhead pressure comprises $P_{SH}^{purge}$=500 mTorr. The volume of the ALD space comprises approximately 400 cm$^3$. Process deposition-chamber steady pressure comprises $P_{114}$=100 mTorr. Flow of purge gas through the showerhead into the deposition chamber during a purge stage is controlled at $Q^{purge}$=1000 sccm. Accordingly, gas residence times, $\tau$=VP/Q, during a purge stage are 1 msec and 3 msec for the showerhead and deposition chamber, respectively. The ALD system and process are designed to conduct ALD with a cycle time in a range of from 400 msec to 500 msec. Each cycle typically comprises a first chemical dosage stage followed by a purge stage, then a second chemical dosage stage followed by another purge stage. Accordingly, the target duration of each stage is about 100 msec. With these exemplary design dimensions and operating conditions, during a purge stage, the exemplary ALD system provides 100 volume sweeps of the showerhead and more than 30 volume sweeps of the deposition chamber. These sweep numbers far exceed the numbers that are commonly achieved using conventional ALD technology (e.g., typically only 3 volume sweeps-10 volume sweeps of a deposition chamber over 1 second-5 seconds of purge time). These substantially improved purge performance and reduced purge times together with improved chemical utilization represent a significant advantage of SMFD apparatus and method over conventional ALD methods and apparatuses. Accordingly, showerhead conductance during a purge stage is calculated and designed as $C_{SH}^{purge}=Q^{purge}/(P_{SH}^{purge}-P_{114})$=31.7 liter/sec. Preferred designs of an SMFD ALD system in accordance with the invention include high sensitivity of showerhead flow to showerhead pressure. Accordingly, nozzles in a nozzle-array FRE are designed to have as high an aspect ratio as is practically possible. For example, in a dense pattern of 600 nozzles across a nozzle-array plate having a diameter of 100 mm, the gas-throughput per nozzle during a purge stage comprises about 1.67 sccm. In a nozzle-array plate having a thickness of 3.125 mm (⅛ inch), the tube-type nozzles have a length of approximately 3 mm. An estimate of nozzle-diameter is calculated using Poiseuille's equation, Equation (1):

$$D = \sqrt[4]{\frac{Q^{nozzle}\eta L}{0.01635[(P_{SH}^{purge})^2 - (P_{114})^2]}} = 0.144 \, cm, \quad (1)$$

in which viscosity of a purge gas is idealized as a viscosity of $N_2$ at 250° C., $\eta=270$ μpoise. The corresponding gas throughput is calculated by Equation (2):

$$Q_{SH}^{purge} = \frac{9.8 \, D^4 ([P_{SH}^{purge}]^2 - [P_{114}]^2)}{\eta L}. \quad (2)$$

For comparison, a showerhead design with 300 aperture-type nozzles having a negligible aperture-length in a nozzle-array plate of 100 mm diameter, in accordance with typical showerhead design, was considered. The conductance, $C=Q/\Delta P$, per nozzle is 105.6 cm³/sec. The area of a nozzle is calculated by Equation (3):

$$A = \frac{C}{\frac{9.13}{1-(P_{114}/P_{SH}^{purge})} \left(\frac{P_{114}}{P_{SH}^{purge}}\right)^{1/\gamma}} \left\{\frac{2\gamma}{\gamma-1}\left(\frac{T_1}{M}\right)\left[1 - \left(\frac{P_{114}}{P_{SH}^{purge}}\right)^{(\gamma-1)/\gamma}\right]\right\}^{1/2} \quad (3)$$

in which $P_{SH}^{purge}$ and $P_{114}$ are the showerhead pressure and the chamber pressure (Torr), respectively, and $\gamma=C_v/C_p$, the gas heat capacity ratio, and is equal to about 1.4 for $N_2$ at 250° C. $T_1$ is the showerhead temperature (assuming that this is also the gas temperature), which is taken as 250° C.=523°K. M is the molecular mass of the gas (idealized as $M_{N_2}$=28 gm/mole). With these values of variables, the approximate area of a showerhead nozzle calculated by Equation (3) is A=4.4×10⁻³ cm². Therefore, nozzle diameter comprises approximately 750 μm. The purge-gas throughput is calculated by Equation (4):

$$Q^{CD} = \frac{9.13 A (P_{SH}^{CD} - P_{114})}{1-(P_{114}/P_{SH}^{CD})} \left(\frac{P_{114}}{P_{SH}^{CD}}\right)^{1/\gamma} \left\{\frac{2\gamma}{\gamma-1}\left(\frac{T_1}{M}\right)\left[1 - \left(\frac{P_{114}}{P_{SH}^{CD}}\right)^{(\gamma-1)/\gamma}\right]\right\}^{1/2}. \quad (4)$$

Figure 3:
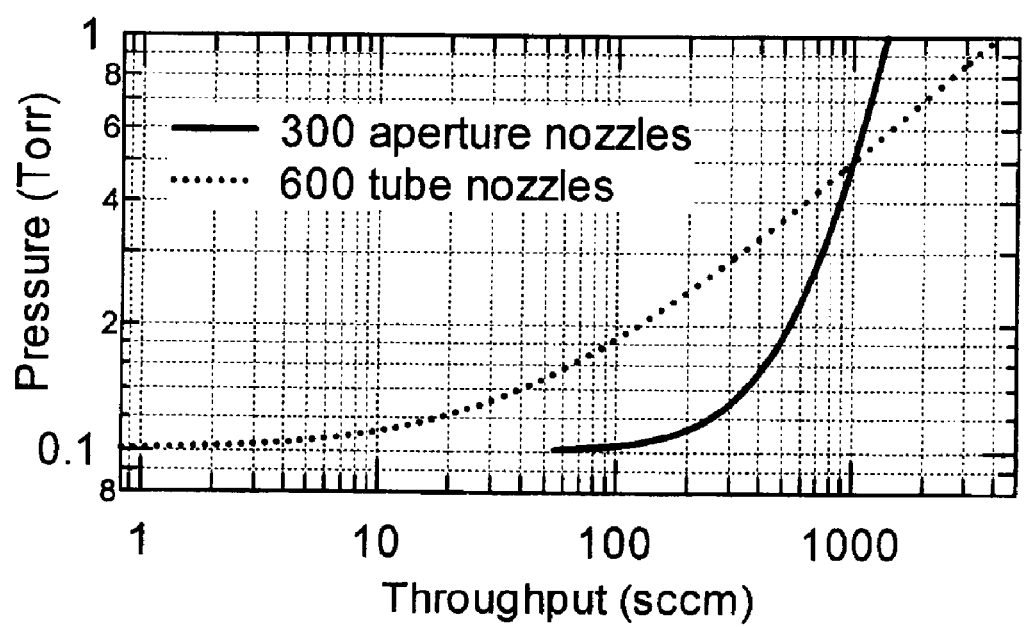
FIG. 3 depicts a graph in which calculated values of showerhead pressure are plotted as a function of chemical-dosage flow rate for the aperture-type and the preferred tube-type nozzle-array designs in a showerhead.

FIG. 3 depicts a graph in which calculated values of $P_{SH}$ are plotted as a function of $Q^{CD}$ for the aperture-type and the preferred tube-type nozzle-array designs described above. FIG. 3 indicates that the tube-type nozzle array design in a showerhead provides preferred throughput-pressure dependence. The two curves of P versus Q intersect, by design, at about the 0.5 Torr-1000 sccm point. However, the tube-nozzle array enables stable pressure-dependent throughput control down to less than 10 sccm, while the aperture-type design allows very limited control at flow rates below about 400 sccm. During the steady-state portion of a chemical-dosage stage, the pressure at the showerhead drops down to $P_{SH}^{CD}$. This reduced showerhead pressure produces lower flow into the ALD deposition chamber, which is compensated by lower draw from the deposition chamber in accordance with the invention. For each 100 mTorr pressure of pure chemical reactant precursor gas, the concentration of chemical at 250° C. is approximately $2\times10^{15}$ molecules/cm³. The total number of precursor molecules in the deposition-chamber-volume of 400 cm³ is ~$8\times10^{17}$. The deposition chamber is estimated to have a total of 1000 cm² of surface area, including non-substrate area. The number-density of reactive sites on a typical intermediate ALD surface is estimated in a range of about from $1\times10^{14}$ sites per cm² to $7\times10^{14}$ sites per cm², or from $1\times10^{17}$ sites per deposition-chamber-area to $7\times10^{17}$ sites per deposition-chamber-area (on the wafer and on other exposed surfaces). According to this estimate, the depletion level following the complete reaction of a stagnant (back-filled) ALD deposition chamber is in a range of approximately from 10%-90%. If less than 100% pure concentration of chemical is dosed, depletion effects are correspondingly more significant. Depletion of chemical extends completion time for ALD reactions. If the partial pressure of chemical reactant precursor molecules is reduced due to depletion, the flux of impinging molecules decreases proportionally. Therefore, although many ALD processes are conducted well with stagnant (backfill) pressure of chemicals, some processes require that chemicals be replenished by a finite flow of chemical reactive gas into the deposition chamber. In practice, some systems require that chemicals be diluted with inert carrier gas to facilitate chemical delivery. In addition, wafers with high density of high surface area device features, such as for dynamic random access memory (DRAM) fabrication, typically cause more substantial depletion effects.

During a chemical dosage stage, the flux of molecules arriving at the surface is approximately $\phi=3.513\times10^{22}$(P/[MT]$^{1/2}$)≈$1.5\times10^{19}$ molecules/cm²/sec for each 100 mTorr of pure chemical reactant pressure at 250° C. (M, the molecular mass of the chemical precursor is idealized here to be 100 gm/mole for the sake of a generic conservative estimate). Accordingly, during a 100 msec pulse, the surface is exposed to ~$1.5\times10^{18}$ collisions per cm². Empirically, ALD reactions approach saturation (>99% reacted) within an exposure range of from $1\times10^{16}$ collisions per cm² to $3\times10^{17}$ collisions per cm². Accordingly, a process pressure of 100 mTorr is typically adequate. Although the timing of an ALD chemical-dosage stage is relatively short (e.g., 100 msec), the exposure that is required is relatively small. Saturation exposure levels depend on the specific reactive sticking coefficient, $\sigma_R$, of the particular reaction. Reactive sticking coefficient is defined by the ratio of successful surface reactions to the actual flux according to the following equations:

$$\frac{\partial n}{\partial t} = -kn; \, and \quad (5)$$

$$n(t) = n_0 \exp{-(kt)} = n_0 \exp{-\left(\frac{\sigma_R \phi t}{n_0}\right)}, \quad (6)$$

where n designates the number-density of reactive sites per cm² and k is the reaction rate. For example, the metal precursor trimethylaluminum typically requires exposure of approximately $3\times10^{16}$ molecules/cm² to react and saturate intermediate Al—OH surfaces during ALD of Al$_2$O$_3$ at about 300° C. The ALD reactions are represented by:

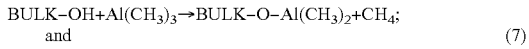

(7)

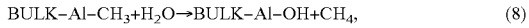

(8)

in which BULK represent the intermediate substrate. The number-density of reactive sites is estimated at 3.9×10$^{14}$. Accordingly, the reactive sticking coefficient is $\sigma_R$=5×3.9× 10$^{14}$/exposure=about 0.064, where exp(−5)=exp[−exposure× $\sigma_R$/(3.9×10$^{14}$)]∼6.7×10$^{−3}$ is adopted as the definition of saturation (i.e., reaction proceeds beyond 99% of reactive sites). Most metal ALD precursors have $\sigma_R$ values in the range from 0.006 to 0.08. Typical nonmetallic precursors such as H$_2$O, NH$_3$, H$_2$S, etc., are less reactive, and their $\sigma_R$ values are typically in a range of about from 0.001 to 0.005. Having such low reactive-sticking-coefficients means that chemical depletion in the region close to the wafer is negligible compared to chemical transport by diffusion at a gas temperature exceeding 100° C. and a process pressure below 1 Torr. Therefore, the existence of transition layers and diffusion-limited transport typically are not a concern. Nevertheless, in some applications where high density of high surface area features exist on the wafer, such as in the case of DRAM wafers, transition-layer effects can cause local depletion at the area of the substrate. Accordingly, two to four times higher exposures than typical smooth surface exposures are useful to suppress these local depletion effects.

As an example, a flow of 50 sccm is assumed as desirable during a chemical dosage to counter depletion. Accordingly, the ALD deposition chamber is swept twice during a 100 msec chemical-dosage stage, causing up to ×3 times suppression of depletion effects. At 50 sccm, the response time of the showerhead and ALD volume are 20 msec and 60 msec, respectively. At <10 sccm of steady-state dosage, which is sufficient to maintain TMA dosage during Al$_2$O$_3$ ALD at 300° C., the response time of dosage under the low steady-state flow conditions is even longer. These time responses are long with respect to the desired chemical dosage time of 100 msec. Accordingly, chemical exposure during 100 msec chemical dosage is reduced down to about 50% (with 50 sccm of chemical dosage flow rate) due to the time that it takes to change the gas in the ALD deposition chamber from 100% inert purge gas into ~100% chemical reacted gas. In preferred embodiments, this potential problem is rectified by an initial transient boost of chemical reactant gas, as explained above.

Figure 4:
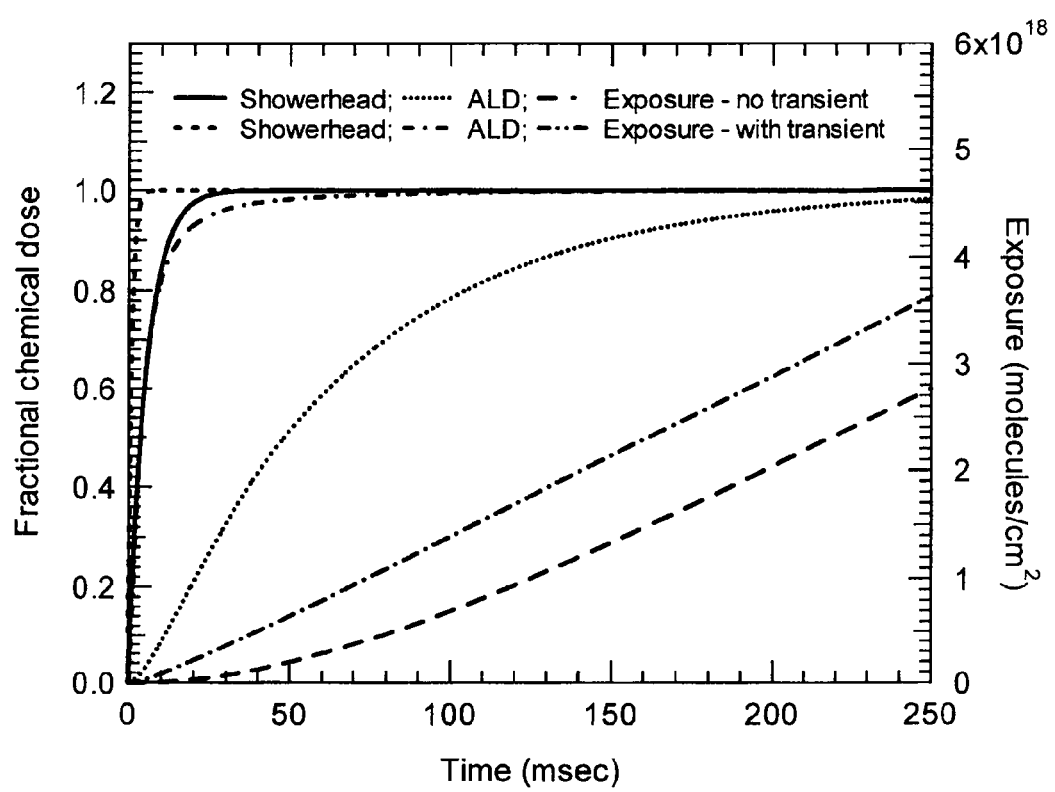
FIG. 4 depicts a graph in which fractional chemical dosage (replacement of inner purge gas by chemical reactant gas) is plotted as a function of chemical-dosage time, for a showerhead and a deposition chamber, with and without a booster-generated transient pulse of chemical at the initiation of the chemical-dosage stage, showing the effect of the booster chamber on chemical-dosage efficiency.

FIG. 4 depicts a graph in which fractional chemical dosage (replacement of inner purge gas by chemical reactant gas) is plotted as a function of chemical-dosage time for a showerhead and a deposition chamber, with and without a booster-generated transient pulse of chemical at the initiation of the chemical-dosage stage. The curves clearly indicate the advantage of implementing transients at leading edges of chemical-dosage stages. The accumulated exposure in the range of useful short dosage times of from 50 msec-100 msec is a factor of two or more higher with the use of a booster transient than without a transient.

Initiation of a chemical-dosage stage with a booster pulse, as described above, is effective in reducing adverse deposition effects from outgassing of residual chemicals. At the beginning of a chemical-dosage stage, the flow of chemical reactant gas is initially relatively high (compared to the ensuing steady-state chemical-dosage flow rate), thereby providing initial high dilution of outgassing residual chemicals (from the previously dosed chemical). Concurrently, the source of outgassing typically reacts with the majority chemical being dosed to produce film inside the crevices and other outgassing areas. When the resulting film is not porous (which is usually the case unless very large concentrations of chemicals were entrapped), the films that are formed by this titration process cause no significant adverse effect on substrate-deposition while the sources of outgassing are essentially being titrated away. According to this mechanism, by the time the transient flow rate has decreased significantly, outgassing is also typically reduced down to ineffective levels. Short chemical-dosage stages with high concentrations are also effective in reducing parasitic deposition from residual outgassing.

Figure 5:
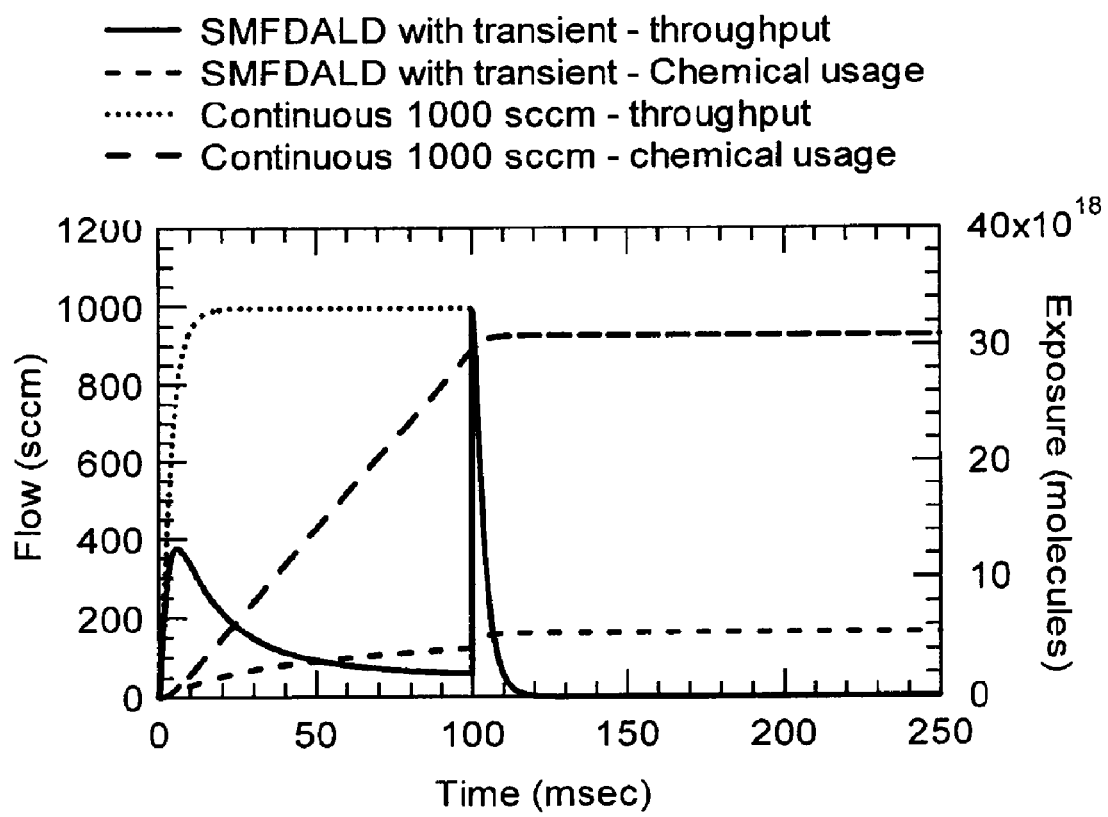
FIG. 5 depicts a graph that compares the actual chemical usage for an embodiment of ALD in accordance with the invention with a conventional continuous flow process as currently practiced in the art.

FIG. 5 depicts a graph that compares the actual chemical usage for an embodiment of ALD in accordance with the invention, as discussed above, with a conventional continuous flow process as currently practiced in the art. Material usage per chemical-dosage stage includes the chemical that was purged out of the showerhead and ALD space during the following purge step. For the case of steady state dosage at 50 sccm, material usage with SMFD ALD in accordance with the invention is more than 5 times smaller than in conventional ALD. Along with much reduced chemical utilization, SMFD ALD in accordance with the invention achieves flux levels and exposures that are similar to the levels obtained by conventional ALD. A flow rate of 1000 sccm of continuous flow in a conventional ALD system allows the conventional system to achieve the chemical-purge performance described above in accordance with the invention, but at the cost of very high chemical utilization. However, implementing such high chemical dosage rates is detrimental to deposition systems and therefore, in accordance with the tradeoff between purge optimization and dosage optimization, conventional ALD apparatuses and methods are forced to compromise purge efficiency and operate at lower flow rates. When lower, more typical flow rates are used for conventional ALD, chemical utilization improves, but purge performance deteriorates substantially.

The challenge of efficient ALD comes from the contradictory requirements for efficient purge and efficient chemical dosage. Neither of these important modes can be seriously compromised in achieving overall efficiency and practically low maintenance. Chemical dosage stages should be made as short as possible, with maximized precursor flux. The higher the concentration and flux of chemical, the shorter the dosage step. Also, parasitic sources of residual chemicals are handled better by a higher flux of majority chemical being dosed. Many ALD precursors have relatively low vapor pressures, making the delivery of high chemical flow rates difficult. In this respect, embodiments in accordance with the invention enhance the ability to deliver undiluted chemical.

Efficient utilization of chemicals lends itself to less complicated and more practical solutions for chemical abatement and chamber maintenance. Preferably, an ALD system is designed to abate at least one of the chemically reactive precursors, for example, the ML$_x$ precursor. From available empirical data, it is known that TMA utilization in preferred embodiments in accordance with the invention is currently about greater than 20% (for material that forms into the thin film on the wafer). Accordingly, most of the chemical is wasted under any conditions. Hot exposed areas within an ALD deposition chamber are typically coated with ALD films. More than 30% is estimated to be deposited on non-wafer surfaces in the deposition chamber. Therefore, in current preferred embodiments, less than 50% of chemical reaction precursor gas entering a deposition chamber leaves the deposition chamber in the draw. In contrast, in a conventional ALD system, about ten times or more chemical reactant gas leaves a deposition chamber than achieved in accordance with the invention.

In conventional ALD systems, which do not provide synchronous modulation of flow and draw, flow modulation is not advantageous. Purge efficiency cannot improve by increasing purge flow since the increased flow would cause a pressure increase that would greatly limit reduction of residence time. For example, the maximum residence time reduction gained from a ×100 increased purge flow is a factor ×10 associated with the maximum theoretical increase in chamber outlet conductance, associated with increased chamber pressure. Chemical dosage at, for example, ×100 smaller flow, would result in adverse reduction of dosage pressure by at least a factor of 10. Accordingly, a conventional ALD system running chemical dosage at 10 sccm and dosage pressure of 100 mTorr would be forced into a pressure of 1 Torr (at least) if purge were attempted at 1000 sccm. In order to match, at least theoretically, the purge performance of SMFD, purge flow rate in a conventional system would necessarily be set to the theoretical minimum of 100000 sccm. Theoretically, purge pressure would reach (and practically exceed) 10 Torr. Under these conditions of flow, and with the typical geometry of ALD chambers for deposition over substantially narrow substrates, such as 200 mm wafers, the Reynolds number would be excessively high and result in unacceptable turbulent flow. Furthermore, pumping at these high flow rates would be prohibitively costly.

Substantial pressure excursions are undesirable in ALD and other systems from many reasons. They generate high levels of particles and, in the case of ALD, could induce back-flowing transients.

In the discussion of FIG. 1, chemical reactant gas from chemical-gas source 105 flows through chemical-source FRE 106, booster chamber 107, and booster-FRE 109. A representative pressure at chemical-source 105 is 10 Torr. Accordingly, the pressure in booster chamber 107 was idealized to reach a pressure equal to $P_{107}=P_{105}=10$ Torr between successive chemical dosages. During a chemical-dosage stage, $P_{107}$ transients down from $P_{105}$ until a steady-state flow is established. In a representative process having a cycle-sequence comprising 100 msec first chemical-dosage stage, 100 msec purge, 100 msec second chemical-dosage stage from another chemical source, and a second 100 msec purge stage, the time between successive chemical dosages from a particular chemical source is 300 msec, which is also the recovery time of booster container 107. In the design of a system and a method in accordance with the invention, it is important to consider that a decrease in the combined flow conductance of chemical-source FRE 106, booster chamber 107, and booster-FRE 109 to cause a corresponding decrease in chemical-dosage flow rate decreases the steady-state pressure in booster chamber 107 and also increases the response time in which booster chamber 107 substantially re-pressurizes during the 300-msec recovery period.

In a representative embodiment in accordance with the invention in which a chemical-dosage flow rate comprises 50 sccm, the steady-state pressure in booster chamber 107 comprises 2.24 Torr. The throughput from booster container to the showerhead is calculated by $Q_{107}=0.127(P_{107}^2-P_{SH}^2)$. Using the Poiseuille equation, the geometry of FRE 109 can be estimated:

$$\frac{D^4}{\eta L} = 7.77 \text{ cm}^3 / \text{poise.} \quad (10)$$

For a 1 cm-long FRE, the diameter ($\eta=270$ µpoise for $N_2$ at 250° C.) is about 0.2 cm. When the design diameter is 0.3125 cm (⅛"), the length is 5.3 cm. Practically, chemical-dosage shut-off valve 110 (FIG. 1) contributes some resistance to flow. Therefore, FRE 109 needs only to provide for the additional flow restriction. In a similar manner, the geometry of FRE 106 can be evaluated from:

$$\frac{D^4}{\eta L} = 0.41 \text{ cm}^3 / \text{poise.} \quad (11)$$

Accordingly, FRE 106 can be made from an 86-cm length of tubing having a diameter of 0.3125 cm (⅛"). Since it is likely preferable, however, that the chemical delivery line be made much shorter, FRE 106 can be implemented by adding a narrower capillary in series with shorter tubing.

During purge, FRE 109 is purged to purge exhaust line 112. This purge is activated concurrently with opening of valve 108. The flow in this purge line is influenced by the combined conductance of FRE 109 and FRE 111. Since the volume needed to be purged is very small (e.g., 1 cm³-2 cm³), efficient purge can be obtained with very small throughput. For example, 20 sccm are sufficient to obtain a 2 msec-4 msec response time. Therefore, the flow in this channel has minor effect on the showerhead pressure and the flow of purge gas into deposition chamber 114. ALD is generally implemented with two (or more) chemical precursors. During a dosage stage with one precursor, A, the line section from showerhead 104 to valve 108' in the manifold of the second precursor, B, stays as a pressurized dead leg. Accordingly, some penetration of precursor A into that section in the manifold of B can occur. Therefore, purging of all chemical reactant gas manifolds preferably is conducted during the purge stage following each chemical-dosage stage.

When the pressure in ALD deposition chamber 114 is 100 mTorr, for example, a representative throughput of purge gas through deposition chamber 114 and through FRE 117 (FIG. 1) is 1000 sccm. The conductance of the pumping path during purge, $C_{pp}=(1/C_{115}+1/C_{117})^{-1}=Q/(P_{114}-P_{pump})$, where $P_{114}=100$ mTorr and $P_{pump}$ is the pressure at the pump. The pressure at the pump depends on the choice of pump and pumping speed. For example, turbomolecular pumps with 1000 liter/sec-2000 liter/sec pumping speed are useful for providing adequate throughput handling for pressures below about 700 mTorr at the pump. Molecular drag pumps with 200 liter/sec-400 liter/sec pumping speed are useful for handling the throughput at pressures in a range of about from 60 mTorr and higher. Pumps for handling high throughput, such as the BOC Edwards (formerly Seiko Seiki) STPA1303C or the Alcatel ATH1600M or ATH2300M, are preferred for embodiments in accordance with the invention. In the present representative calculation, a 2000 liter/sec turbopump and a pump pressure of 6.3 mTorr were assumed. Accordingly, a value of $C_{pp}=135$ liter/sec was calculated.

When the conductance of FRE 115 is about 1000 liter/sec at a flow and corresponding draw of 1000 sccm, the pressure, $P_{116}$, at draw control chamber 116 is calculated as $P_{116}=0.1-Q/C_{115}=87.3$ mTorr. The conductance of FRE 117 is calculated as $C_{117}=(1/C_{pp}-1/C_{115})^{-1}=156$ liter/sec. In an exemplary apparatus as depicted in FIG. 2, substrate holder 205 has a diameter of about 220 mm. FRE 115 is configured as curved elongated slots. One of these slots is used to accommodate wafer loading. Three identical slots are located along the perimeter at 220 mm diameter with trapezoidal spacers that are 1 cm wide at 220 mm diameter. The width of each slot is about 22 cm. The length of the slots is considered to be 1 cm. The conductance of a single slot is approximately 333 liter/ sec. The conductance is approximated by the expression of Heinze for rectangular cross-sections:

$$C = 0.083 \frac{a^3 b}{\eta} \left(\frac{P}{L}\right) \psi, \quad (12)$$

in which a is the short dimension of the rectangle, b is the long dimension, and ψ is given by the graph of Williams et al. as a function of a/b. η is taken for $N_2$ at 523°K~270 μpoise. Assuming a/b of ~0.04, ψ is estimated to be ~0.97. The height of the slot, a, is calculated by:

$$a = \sqrt[3]{\frac{12 C \eta L}{b \overline{P} \psi}} = 0.82 \text{ cm}. \quad (13)$$

This gap is narrow but sufficient to accommodate a wafer loading end-effector and a wafer for wafer handling. The slot dimensions ratio, a/b=~0.037, and ψ=~0.97, are consistent with assumptions (beyond other error factors). For exemplary dimensions of deposition chamber 203 in which the diameter is about 22 cm and the height is about 1 cm, $V_{ALD}$=~400 cm³. For example, the height of deposition chamber 203 transitions smoothly from 1 cm at the wafer area to 0.82 cm at the slot.

The conductance of FRE 209 in FIG. 2 is influenced by the gap between insert 207 and chamber wall 221. In another embodiment, the gap between insert 207 and chamber wall 221 is designed to be very small and other openings at the bottom of insert 207 provide the major conductance path for FRE 117. The area of conductance is estimated using Equation (14):

$$A = \frac{C}{\frac{9.13}{1-(P_{pump}/P_{116})} \left(\frac{P_{pump}}{P_{116}}\right)^{1/\gamma} \left\{\frac{2\gamma}{\gamma-1}\left(\frac{T_1}{M}\right)\left[1-\left(\frac{P_{pump}}{P_{116}}\right)^{(\gamma-1/\gamma)}\right]\right\}^{1/2}} = 12.45 \text{ cm}^2. \quad (14)$$

In the case of FRE 117, an aperture type conductance is useful to make the conductance practically independent of $P_{pump}$. Accordingly, if $P_{pump}/P_{16}$ is less than 0.1, $C_{117}$ is practically pressure independent and is calculated by $C_{117}$≅12.53A≅156 liter/sec, in which A is the total area of the aperture. This characteristic of FRE 117 makes the performance of an SMFD ALD system in accordance with the invention relatively insensitive to pumping speed drifts and makes active pump pressure control unnecessary in typical embodiments.

During a steady-state period of a chemical-dosage stage, draw-control gas is flowed through draw-source shut-off valve 120 into draw control chamber 116 (FIG. 1). The draw pressure in draw control chamber 116 is thereby elevated to reduce the draw of chemical reactant gas out of deposition chamber 114, thereby independently matching the draw of chemical reactant gas to the flow of chemical into deposition chamber 114. When the steady-state flow of chemical reactant gas into deposition chamber 114 is 50 sccm, the chemical-dosage draw pressure in draw control chamber 116 must be elevated up to:

$$P_{116} = \sqrt{0.01 - 1.87 \times 10^{-4} Q} = 99.4 \text{ mTorr}. \quad (15)$$

Flow throughput through valve 120 must sustain this pressure at 116. The throughput from draw control chamber 116 to the pump is $Q_{120}$=$C_{117}(P_{116}-P_{pump})$=156×(0.0994-0.0063)=14.5 liter Torr/sec≈1150 sccm. Of this throughput, 50 sccm is the draw from deposition chamber 114 and 1100 sccm is draw gas that flowed through valve 120.

The performance of a well-designed SMFD ALD system in accordance with the invention does not critically depend on precise control of gas flow rates and pressures. Accordingly, a well-designed SMFD ALD apparatus is not sensitive to standard and customary tolerances of part manufacturing and commercially available instrumentation and components. For example, the increase in chemical-dosage draw pressure in draw control chamber 116 may vary by 5% to 10% without significantly affecting the independent, substantial matching of draw to flow and chemical-dosage characteristics. The steady-state flow of chemical during a chemical dosage is relatively insensitive to the pressure in the deposition chamber. Fluctuations or drift of steady-state flow are not critical either. When the flow rate of draw gas through valve 120 into draw control chamber 116 varies or drifts, both the draw pressure in draw control chamber 116 and the pressure in deposition chamber 114 drift concurrently and smoothly to compensate for any significant drift in draw gas flow rate into draw control chamber 116 with only minor and insignificant drift in process pressure.

Figure 6:
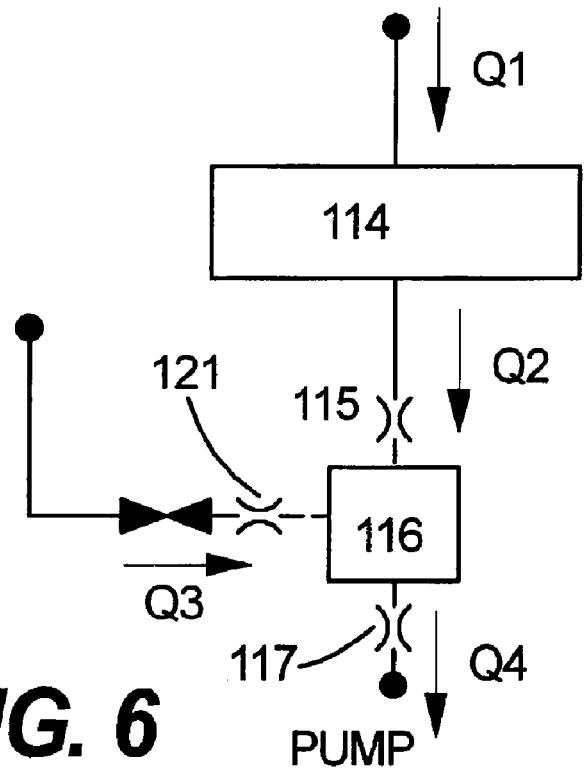
FIG. 6 depicts in schematic form various flow streams of gases through an SMFD ALD system in accordance with the invention.

This important "self-correction" characteristic of systems and methods in accordance with the invention is explained with reference to FIG. 6. FIG. 6 depicts in schematic form various flow streams of gases through an SMFD ALD system in accordance with the invention. The flow rate of chemical into deposition chamber 114, Q1, is determined by the upstream manifold (source 101, FRE 103, source 105, FRE 106, booster 107, FRE 109, FRE 113) and is very insensitive to the pressure, $P_{114}$, in deposition chamber 114. The draw from deposition chamber 114, Q2, into draw control chamber 116 is determined by the conductance of FRE 115 and the pressures $P_{114}$ and $P_{116}$. The flow rate of draw gas through valve 120 into compartment 116, Q3, is very insensitive to the pressure, $P_{116}$, in draw control chamber 116 and is determined primarily by FRE 121 and the pressure behind it. The flow rate of gas out of draw control chamber 116, Q4, is determined by the conductance of FRE 117 (~156 liter/sec) and the pressures $P_{116}$ and $P_{pump}$. The time dependent behavior of all pressures and throughput rates in the system during chemical dosage is simulated using the following simplified expressions:

$$Q1 = 0.63 + 12.04 e^{-\frac{t}{0.005}}; \quad (16)$$

$$Q2 = 5326(P_{114}^2 - P_{116}^2); \quad (17)$$

and $$Q4 = 156(P_{116} - P_{pump}); \quad (18)$$

$$P_{pump} = \frac{Q4}{2000};$$

$$Q4 = \frac{156}{\left(1+\frac{156}{2000}\right)} P_{116} = 145 P_{116}.$$

Also, the volume of deposition chamber 114 is 0.4 liter and the volume of draw control chamber 116 is 3 liters. Calculations were conducted using a model represented in FIG. 6 and Equations (16), (17), and (18).

Figure 7:
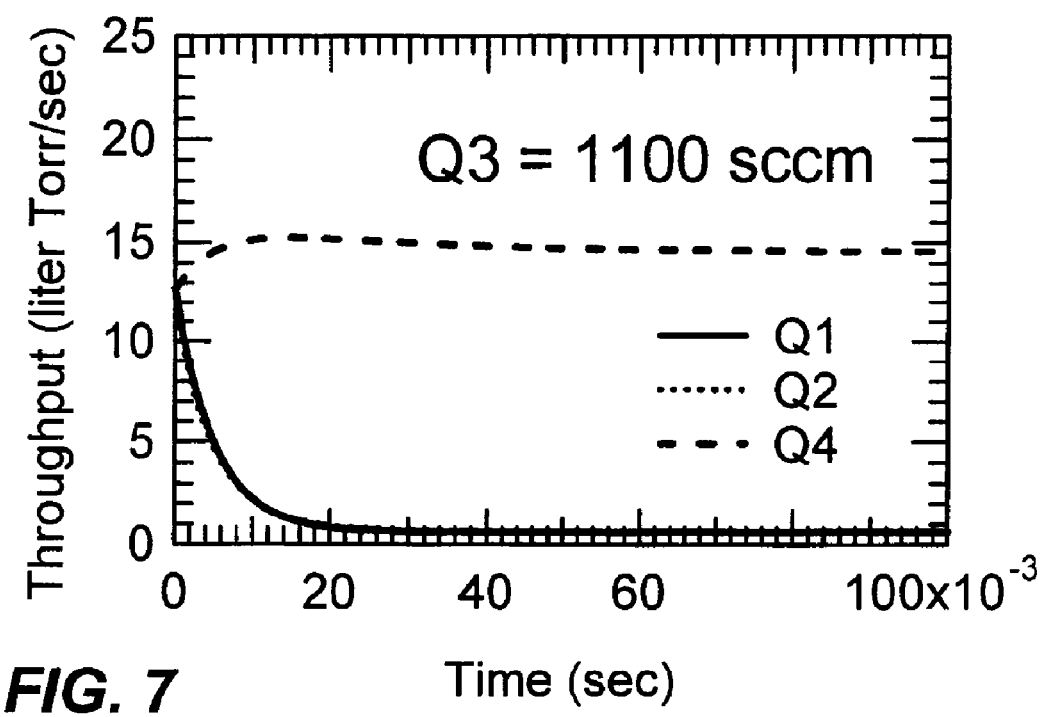
FIG. 7 displays in graphic form the calculated time dependence of flow rates Q1, Q2, and Q4 when Q3 was set at 1100 sccm (with reference to FIG. 6)
Figure 8:
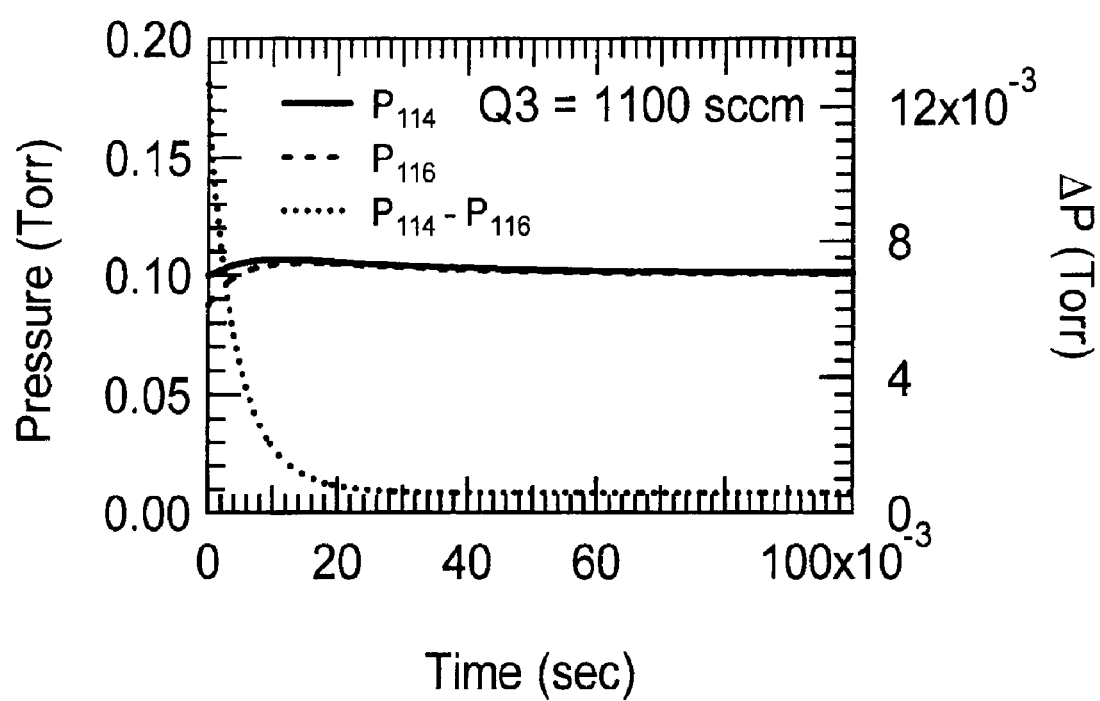
FIG. 8 displays the time dependence of deposition-chamber pressure, draw chamber pressure, and their pressure differential, ΔP, when Q3 (of FIG. 6) is 1100 sccm.
Figure 9:
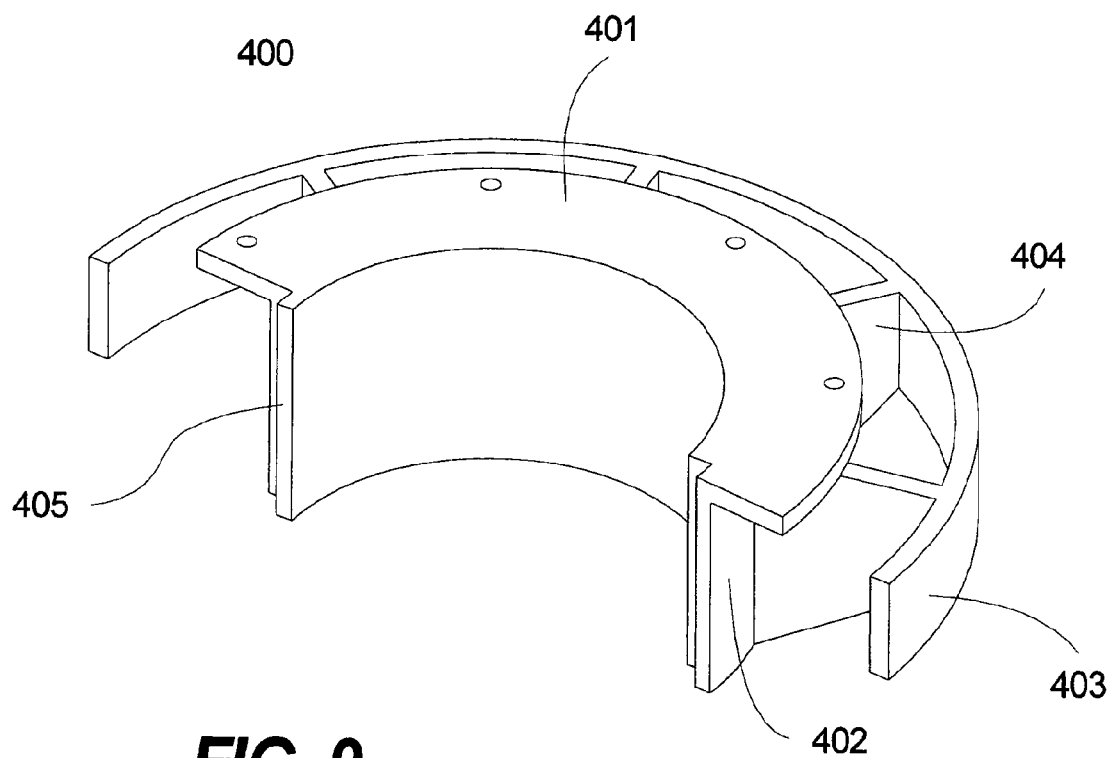
FIG. 9 depicts in schematic form a design of an exemplary chemical abatement element in accordance with the invention.

FIG. 7 displays in graphic form the calculated time dependence of Q1, Q2, and Q4 when Q3 was set at 1100 sccm, which was evaluated to be close to an optimum value according to previous calculations. Q4 overshoots the steady-state value during the initial, transient part of the chemical-dosage stage. This overshoot is due to mismatch between the transients Q1 and $P_{116}$ provided in our example. The transient variable values can have substantial mismatch with only minor effect on the important parameters of the system (i.e., $P_{114}$, $\Delta P = P_{114} - P_{116}$, Q1, Q2). FIG. 8 displays the time dependence of $P_{114}$, $P_{116}$, and $\Delta P = P_{114} - P_{116}$. Due to the transient mismatch, there is a slight increase of $P_{114}$ at the transient region (from 100 mTorr up to ~105 mTorr). This insignificant pressure rise is smooth and has no effect on system performance. This pressure rise is rectified by adjusting the transient of $P_{116}$ to be slower. Given the insignificant effect on system performance, however, optimization is not really needed. More importantly, FIG. 8 shows that the pressure in the chamber levels off to 101 mTorr, and that $\Delta P = P_{114} - P_{116}$ is always larger than zero. This important property means that the system is resistant to backflow from draw control chamber 116 back into deposition chamber 114. As simulated and tested over a wide range of variations, this immunity against backflow is robust and is insensitive to major drifts of Q3, as well as to asynchronous actuation of valves.

Additional calculations have simulated time-dependence of $P_{114}$ under five different Q3-values; namely, Q3=900, 1000, 1100, 1200, 1300 sccm. The calculated value of $P_{114}$ varied within a narrow range. For example, starting at an initial value of 100 mTorr, after 100 msec $P_{114}$ settled down to about 118 mTorr, at Q3=1300 sccm, and to 84 mTorr at Q3=900 sccm. More importantly, calculated values of $\Delta P = P_{114} - P_{116}$ were always positive for all values of Q3 between 900 and 1300 sccm. Starting at $\Delta P = 12.5$ mTorr at time=0, the calculated values of $\Delta P$ were within about 5 mTorr to 7 mTorr after 20 msec. Thus, the pressure in the chamber smoothly drifts in a relatively tight range in spite of a 40% variation in Q3. In addition, the pressure differential $\Delta P = P_{114} - P_{116}$ never turns negative, indicating that the system self-reacts very effectively to prevent backflow from draw control chamber 116 back into deposition chamber 114. The simulation results indicated that, even under extreme and non-realistic drifts of Q3, the effect on system performance is negligible. Using methods and instrumentation known in the art, Q3 can be maintained at 1100±50 sccm so that fluctuations in $P_{114}$ are easily contained within a range of 100±5 mTorr. As described in Example 1 below, actual empirical data resulting from operation of an exemplary embodiment in accordance with the invention confirmed simulation behavior. In fact, SMFD ALD system was tested within the range of from 400 sccm to 1500 sccm to be able to appropriately perform while controlling dosage pressures within the range of from 100 mTorr to 500 mTorr.

System robustness extends to all critical aspects of embodiments in accordance with the invention. For example, calculations of the simulation model were conducted to test the sensitivity of $P_{114}$ to the volume of draw control chamber 116. The volume of draw control chamber 116, $V_{116}$, was varied in a range of from 1.5 liters to 12 liters. The draw-gas flow rate, Q3 (see FIG. 6), was set at 1100 sccm. Starting at $P_{114}$=100 mTorr at time=0, $P_{114}$ stayed within a range of from 95 mTorr to 115 mTorr. Corresponding calculations of $\Delta P_{114} - P_{116}$ indicated practically no dependence on $V_{116}$. Similar calculations conducted for Q3=1200 sccm and Q3=900 sccm indicated similar minor sensitivity of $P_{114}$ and $\Delta P$ to $V_{116}$. These calculations indicated the wide range of transient mismatch that an SMFD system in accordance with the invention is able to tolerate.

The simulation calculations described above used a value of steady-state chemical-dosage flow rate, Q1, of 50 sccm. Further calculations with the simulation model set values of Q1 to 25 sccm and 100 sccm. For these simulations, $V_{116}$=3 liters, $$Q1 = 0.315 + 12.355 e^{-\frac{t}{0.005}}$$

for the 25 sccm case, and $$Q1 = 1.26 + 11.41 e^{-\frac{t}{0.005}}$$

for the 100 sccm case. Draw-gas flow rate, Q3, was simulated for 900 sccm, 1100 ("ideal case") sccm, and 1300 sccm. The resulting calculated values of $P_{114}$ under the various simulated conditions were all in a range of about from 80 mTorr to 120 mTorr, indicating the system is stable and performance is robust. The simulation calculations also indicated that system instabilities generated by non-synchronized actuation of valves 110 and 121 are also absorbed well by the system and result in only minor $P_{114}$ fluctuations. Synchronization mismatch of ±5 msec are handled well by the system throughout the range of Q3-values from 900 sccm to 1300 sccm.

$P_{114}$ excursions can be controlled to within 10% of design values. At this level, these pressure transients do not pose any significant performance penalty. A minor pressure increase within 10% causes a minor gas residence-time increase during purge. Nevertheless, in view of the purge efficiency of approximately $10^{14}\times$, a slight reduction in purge efficiency (simulated to be about 6×, at worst, under tested simulation conditions) is insignificant. Therefore, $P_{114}$ transients caused by closing a chemical-dosage shut-off valve 110, 110' are not a major design concern. Nevertheless, these transients can be efficiently rectified, if necessary, using one or a combination of the following measures: (1) split purge-gas delivery line 101, 102, 103 (FIG. 1) into two lines that split the 1000 sccm inert purge into equal or different throughput rates that sum up to 1000 sccm; actuate one purge-gas line concurrently with closing the chemical-dosage shut-off valve; and then actuate the second purge-gas line with some delay; (2) reduce the volume of draw control chamber 116; (3) increase the volume of the gas distribution chamber (showerhead) 104; and (4) use a well-controlled delay of several milliseconds between closing draw-source shut-off valve 120 and then opening purge-source shut-off valve 102. For example, the synchronization between chemical dosage valves 110, 110' and draw control valve 120 (FIG. 12) at the onset of chemical-dosage step was varied by introducing delay in the range of from 0 msec-10 msec. Both TMA and $H_2O$ dosage steps optimized to deposit $Al_2O_3$ with a cycle time below 500 msec were tested. In the range that was tested, we found essentially no impact of this gross valve asynchronization.

In certain preferred embodiments in accordance with the invention, pressure modulations are synchronized with flow modulations. For example, higher pressure during chemical dosage is implemented by increasing the flow, Q3, into compartment 116 (FIG. 6). For example, simulation calculations indicated a semi-linear dependence of deposition-chamber-pressure, $P_{114}$, on Q3. Accordingly, $P_{114}$ (mTorr) is approximated by the formula: 7.5+0.085×Q3. The reaction rate of H₂O dosage was tested during the deposition of Al₂O₃ under conditions where TMA was saturated and H₂O was at ~70% from saturation. Qualitatively, H₂O reaction rates were enhanced at higher dosage pressure. Higher pressures could be beneficial during a chemical-dosage stage to increase flux and speed-up reactions. Most ALD processes, however, reach saturation at a pressure in a range of from 100 mTorr to 200 mTorr within 10 msec to 50 msec. Therefore, pressure modulations are typically not necessary. Also, implementation of synchronized flow and pressure modulations using different pressures during different chemical-dosage stages of different chemicals is possible and requires additional draw-source shut-off valve and draw-source FRE in parallel to 120, 121 to facilitate, for example, three (selectable) different draw-gas flow rates into draw control chamber 116. An example of an additional shut-off valve and draw-source FRE in parallel is shown in ALD system 500, depicted in FIG. 10. System 500 comprises draw-source shut-off valve 530 and draw-source FRE 532 in parallel to 120, 121.

ALD chemistry produces, by design, solid films. These films, if deposited inside pumps, valves, and gauges, produce accelerated deterioration of the downstream manifold. Practical and cost considerations limit the temperature that can be maintained at the downstream manifold to below 200° C., and typically at about 100° C. and below. Therefore, the walls of the downstream manifold are susceptible to significant adsorption of ALD-type chemicals and to growth of deposits that are porous and loose. These inferior deposits clog the downstream manifold quickly and also cause serious particle contamination in the system. In addition, maintenance generally requires complete disassembly of downstream manifolds, and the process of cleaning is tedious and expensive.

Preferred embodiments in accordance with the invention provide chemical abatement to reduce and avoid problems associated with deposits of chemicals on non-substrate surfaces. Effective chemical abatement removes unreacted chemicals present in the process gas stream (to draw) that leaves the deposition chamber, and thereby provides a maintenance-free downstream manifold and extends the lifetime of pumps, valves, and gauges. This results in a major cost reduction and extended uptime. An integrated abatement system is implementable with a variety of designs without affecting the performance or efficiency of the ALD system.

The process gas stream (draw) flowing out of the deposition chamber in an SMFD ALD system and method in accordance with the invention contains roughly ¹⁄₁₀ the amount of unreacted chemical reactant gas as in a conventional ALD system. For this reason, embodiments in accordance with the invention are particularly well-suited for achieving nearly complete chemical abatement. In addition, the draw control chamber, for example, chamber 116 in FIG. 1, is well-suited for chemical abatement because it is characterized by a robust suppression of backflow, by a significantly extendable residence time that is uncoupled from the residence time in the deposition chamber, and most importantly, by the ability to flow high throughput of gases during a chemical-dosage stage that can be inert or reactive and can be used to induce substantially efficient deposition of high quality films on easily removable surfaces or on surfaces that can be easily cleaned in-situ inside the draw control chamber.

An objective of integrated chemical abatement in accordance with the invention is to provide a well-defined place and well-defined and cost-effectively maintainable surfaces for removing reactive chemicals from the process gases in the draw from an ALD deposition chamber, thereby preventing inferior deposition of solid deposits further downstream. Accordingly, it is desirable to perform chemical abatement as close as possible to the deposition chamber, since carrying the effluents further downstream without growth of deposits in the flow-path is complicated, expensive, and often impossible. Another objective of integrated abatement is conversion of the chemicals into high-quality films on substantially large surfaces that increase the capacity of the abatement device and extend time between required maintenance.

Most ALD processes known today are implemented with two different chemicals; for example, $ML_x$ and $AH_y$. One of these chemicals, typically $ML_x$ (the precursor containing the metal or semiconductor atoms), is substantially more reactive than the other precursor. Chemical abatement is effectively accomplished when the more reactive precursor, for example, $ML_x$, is substantially eliminated, leaving only the less reactive precursor, for example, $AH_y$, in the effluent-outlet. Conveniently, the elimination of the solid producing precursor, $ML_x$, effectively makes the remainder of the effluent gas inactive and volatile. As a result, growth of solid deposits is effectively suppressed because good ALD precursors are, by definition, stable and do not react or decompose alone. By eliminating the metal precursor, $ML_x$, accumulation of solid materials in the downstream manifold is prevented. Conventional known chemical-removal techniques can then be used to remove the less reactive chemical precursor, reaction by-products, and other volatile compounds upstream or downstream of the pump.

Typically, only one ALD precursor, the metal (or semiconductor) containing precursor $ML_x$ (e.g., trimethylaluminum), makes solid deposits. Often, the other precursor, $AH_y$ (e.g., H₂O), is preferably dosed at high pressure to accelerate the slow reaction. SMFD enables $AH_y$ dosage even at 100% concentration, if necessary. Therefore, the abatement process consumes all or most of the $ML_x$ and typically only a small fraction of $AH_y$.

Any practical ALD system, whether conventional ALD or SMFD ALD in accordance with the invention, is efficiently operated to provide only the minimum purge time to purge the ALD precursors out of the deposition chamber. While $ML_x$ precursors can be eliminated by the abatement process, the $AH_y$ precursors tend to accumulate in the abatement space. Additionally, abatement chambers must have a relatively large volume and also contain high area surfaces, making them even harder to purge and more susceptible to the accumulation of $AH_y$ precursor. Accumulation of finite partial pressures of $AH_y$ in an abatement chamber during an optimized high-throughput ALD process generally cannot be avoided. The quality of abatement films (deposits) depends inversely on the partial pressure of $AH_y$. The higher the partial pressure of $AH_y$, the more inferior the films. An objective of abatement is to promote growth of high-quality film deposits. SMFD effectively reduces the partial pressure of $AH_y$ in the abatement space by providing high-dilution flow of a draw gas through the draw-control-abatement chamber during chemical-dosage, and higher flow of purge gas during purge stages. Thus, SMFD inherently provides a mechanism for improved quality of abatement films.

In a conventional ALD system, the accumulation of partial pressure of $AH_y$ causes adverse back-diffusion of $AH_y$ from the abatement chamber back upstream into the deposition chamber. As a result, $AH_y$ can create an adverse CVD signature in the deposition chamber. In contrast, SMFD in accordance with the invention effectively suppresses potential diffusion from the draw-control-abatement chamber by reducing the accumulated partial pressure of $AH_y$, as well as by providing substantial forward flow that deters diffusion.

Certain embodiments of SMFD in accordance with the invention having integrated chemical abatement use the ALD chemicals to promote CVD and ALD-reactions on the high surface-area abatement elements located inside the draw control chamber. For example, a hot inner wall 225 of draw control chamber 208 (FIG. 2) sustained at the hot plate temperature, or alternatively at a separately controlled elevated temperature, is fabricated using porous metal or ceramics with increased surface area. The high surface area and relatively long residence time in draw control chamber 208 are designed for efficient, nearly 100% depletion of the most reactive chemical. Most of the downstream solid deposits are thereby confined to highly localized high-quality films on a removable insert that can be removed for ex-situ cleaning, or can be in-situ cleaned inside chamber 208. The external wall 221 of draw control chamber 208 (FIG. 2) is protected by a removable liner when in-situ cleans are not feasible.

Design and material composition, as well as porosity, of an abatement element depend on the particular chemical reactants of the ALD process and on the design of SMFD reactor vessels. A design of an exemplary chemical abatement element 400 is depicted in schematic form in FIG. 9. Abatement element 400 comprises porous tungsten having 50% porosity, pore size of about 50 μm, and ⅛" thickness. Abatement element 400 is attached to the bottom part of wafer heating chuck 205 (FIG. 2) using flange 401. Two elements 400 are attached to chuck 205 to form a radial element. The two pieces are designed to lock into place with matching steps 405. Inner wall 402 forms inner wall 225 of annular-shaped draw control chamber 208 (FIG. 2). Abatement element 400 is assembled from two complimentary parts that are better suited for fast assembly and disassembly during maintenance. Outer ring 403 (not shown in FIG. 2) represents an additional area enhancement and is in close proximity to outer wall 221 of draw control chamber 208. Rings 402 and 403 are interconnected by several fins 404 that are similarly made from porous W. A pair of assembled abatement elements 400 provides approximately 1000 cm$^2$-2000 cm$^2$ macroscopic area (the area of the flat tungsten) and about 15,000 cm$^2$-30,000 cm$^2$ of actual area. The assembled pair fits a 2-liter draw control chamber and are designed for approximately 99.9% entrapment of trimethylaluminum (TMA) from the draw stream out of the deposition chamber during a TMA-H$_2$O ALD process commonly used to grow high quality Al$_2$O$_3$ films.

ALD deposition of Al$_2$O$_3$ using an SMFD apparatus and a method in accordance with the invention demonstrated efficient abatement of TMA from the stream of exhaust gas. Growth of good-quality Al$_2$O$_3$ films on the abatement surface located in the draw control chamber were achieved because of the good chemical utilization efficiency of SMFD and because SMFD, in comparison to conventional ALD apparatuses, inherently maintains lower levels of AH$_y$ by virtue of continuous high flow of inert gas through the abatement space. Under high H$_2$O dosage conditions, somewhat above saturation, some growth of inferior films on some area of the abatement element was observed. High quality abatement films were transparent and had a good interference pattern. In contrast, inferior films tend to have a white powder-like appearance. Accordingly, the abatement apparatus and method was improved by increasing the flow rate of draw gas to further improve H$_2$O utilization, while at the same time additional dilution of H$_2$O in the draw chamber was provided. Additionally, TMA abatement was much improved by injecting a slow flow of ozone into the draw/abatement chamber during the TMA dosage step and shortly after the completion of the TMA dosage step. This ozone injection, as described below, was synchronized with the ALD process.

When a draw control chamber comprises a small volume (e.g., 1 liter or less), or when the ALD precursors do not react fast enough at the temperatures sustained at abatement element 400, or when smaller area abatement elements are desired to reduce AH$_y$ accumulation effect (by suppressing chamber memory) or to reduce cost, embodiments in accordance with the invention are modified to increase abatement efficiency without sacrificing ALD performance using one or several of the following measures, among others.

Flowing a reactive abatement gas into draw control chamber 116 instead of, or in addition to, the inert gas during the chemical-dosage stage of ML$_x$ chemical enhances chemical abatement. Addition of a selected reactive gas provides a reactive CVD path to generate high quality solid film deposition on the area of the abatement element and thereby to remove the chemical from the process stream. For example, addition of ozone into draw control chamber 116 during chemical-dosage of TMA causes very efficient deposition of Al$_2$O$_3$ CVD films on an abatement surface. The ozone abatement process competes favorably and dominates undesired CVD reaction between the ALD precursors while enabling efficient abatement with substantially smaller area surfaces. This approach is easily implemented for most ALD processes to eliminate the most reactive (e.g., metal) precursors from exhaust effluents. Ozone is easy to generate, and various suitable commercial ozone-generators are available, such as the MKS ASTeX AX8400.

Figure 10:
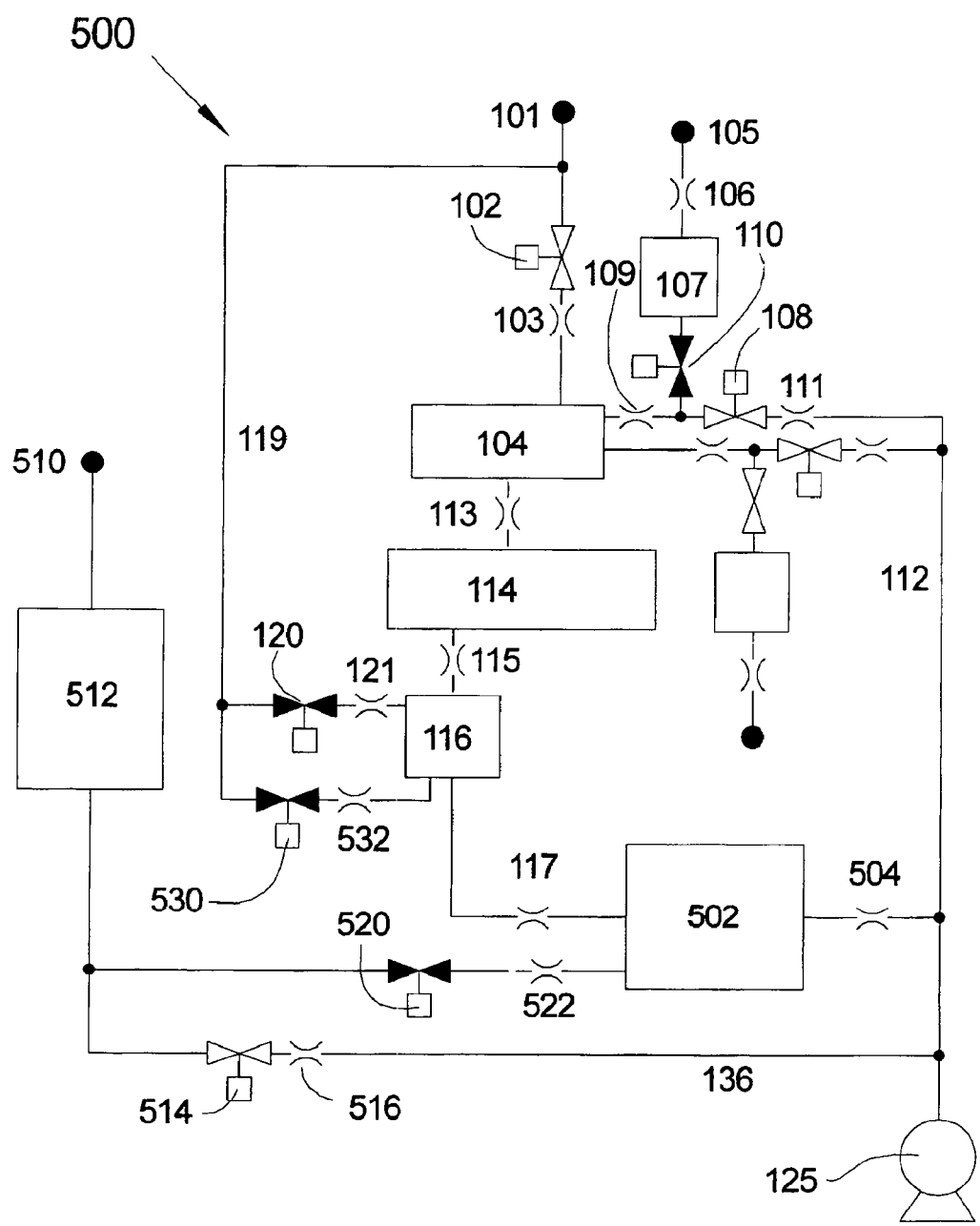
FIG. 10 depicts a flow diagram of an ALD system in accordance with the invention comprising a separate abatement chamber downstream from the draw control chamber.

Providing a larger volume of abatement space with a second, separate abatement chamber without negatively affecting the gas-dynamics or residence time of draw control chamber 116 enhances chemical abatement. FIG. 10 depicts in schematic form an SMFD ALD system 500 in accordance with the invention comprising separate abatement chamber 502, which provides a large surface area for abatement and a substantial gas residence time. Gases containing unreacted chemical precursor flow out of draw control chamber 116 through draw-control FRE 117. After chemical reaction in abatement chamber 502, gas flows through abatement-chamber-FRE 504 to vacuum pump 125. In certain embodiments, an isolation gate valve is located in serial fluidic communication between abatement chamber 502 and draw control chamber 116 to allow servicing of the abatement chamber without the need to break vacuum at the deposition chamber. Also, a reactive gas, as described above, is useful to further improve the efficiency of abatement chamber 502 and the quality of the deposits. In certain embodiments, an inert gas protected conduit can be used to prevent growth of deposits in the conduit section between draw control chamber 116 and abatement chamber 502. The design of this type of conduit is described in U.S. Pat. No. 5,827,370 issued Oct. 27, 1998 to Youfan Gu, which is hereby incorporated by reference.

Generating a plasma inside abatement chamber 502 further enhances chemical abatement. A plasma-forming gas, such as Ar, is useful to improve plasma characteristics and can be provided as part of or the entire draw control gas.

System 500 in FIG. 10 further comprises an ozone generator. Oxygen is fed from oxygen source 510 into ozone generator 512, where the oxygen is continuously partially converted to ozone. The mixture of O$_2$/O$_3$ passes to vacuum pump 125 through ozone vacuum valve 514 and ozone-vacuum FRE 516. When abatement is necessary during chemical dosage of one of the precursors, for example, ML$_x$, the O$_2$/O$_3$ mixture is routed into abatement chamber 502 by closing vacuum valve 514 and opening ozone-source valve 520 so that the ozone mixture flows through ozone-source FRE 522 into abatement chamber 502.

Maintenance procedures for an SMFD system in accordance with the invention vary with the application. Generally, in-situ maintenance is preferred. In-situ maintenance of draw control chamber 116 and/or abatement chamber 502 is preferably conducted using the backflow-suppression characteristic of the system to provide aggressive cleaning of chambers 116, 502 that could otherwise damage deposition chamber 114. For example, silicon or tungsten compounds can be removed with $NF_3$, $ClF_3$, and other fluorine sources. Initially, deposits in deposition chamber 114 and draw control chamber 116 are cleaned with a gentle procedure to prevent possible damage to sensitive elements inside the deposition chamber, such as the wafer chuck, wafer lift pins, etc. Once the deposition chamber is cleaned, the deposition chamber is protected by a slow flow of inert gas through the gas distribution chamber. More substantial deposits inside draw control chamber 116 and abatement chamber 502 are then cleaned with substantially more aggressive cleaning procedures, while backflow-suppression prevents high levels of fluorine and other energetic species from affecting the deposition chamber.

In other common cases, useful ALD films such as $Al_2O_3$, $HfO_2$, etc., cannot be cleaned in-situ. In these cases, removable inserts are removed from the deposition chamber and replaced with a clean insert.

Integrated abatement, as described above, extends maintenance schedules and effectively suppresses performance deterioration. Deposits are limited to high quality films that, in most cases, can be grown to a thickness greater than 100 μm without peeling. Accordingly, thousands of wafers can be processed without maintenance interruptions, even when the system cannot be cleaned in-situ. In addition, maintenance procedures are reduced to the industry standard of several hours of down time for replacement of few parts and re-qualification. Furthermore, the abatement eliminates solid deposits from downstream lines and components.

Figure 11:
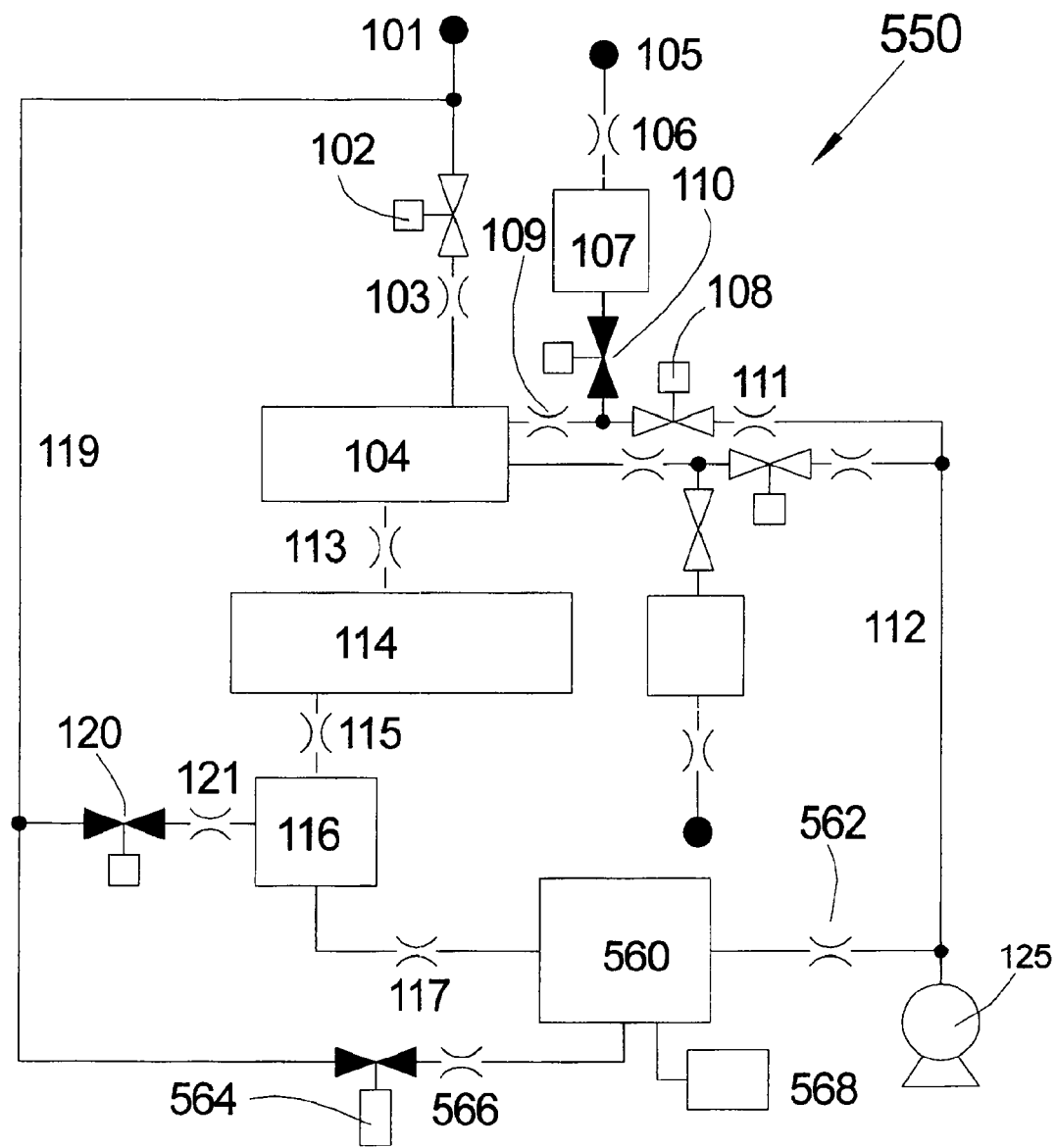
FIG. 11 depicts a flow diagram of an ALD system in accordance with the invention comprising an active pressure control chamber.

Generally, it is not necessary to implement any active control over pressure. As described with reference to FIG. 6 and Equations (16), (17), and (18), the pressures in SMFD ALD chambers are determined by multiple FREs, as well as the controlled pressures of gas sources, such as draw-gas source 101, purge-gas source 101, and chemical-gas source 105 (FIG. 1). It is also known that pumping speed drifts generate only minor effects on the deposition chamber pressure, $P_{114}$, and on gas flow and draw. Accordingly, active control of pressure at the pump, e.g., at the outlet of FRE 117 (FIG. 1), is generally unnecessary. Nevertheless, when necessary or desired, active pressure control is implemented at the vacuum pump by conventional techniques, such as controlling the speed of mechanical (turbomolecular, dry pump, root-blower, etc.) pumps, or by using common throttle devices. Alternatively, as depicted in FIG. 11, a system 550 in accordance with the invention comprises a pressure control chamber 560 located downstream from draw control chamber 116 between draw-control FRE 117 and vacuum pump 125. Pressure-control FRE 562 is located between pressure control chamber 560 and vacuum pump 125. Inert gas (e.g., from draw-gas source 101) passes through a proportional valve 564 through FRE 566 into a pressure control chamber 560. The pressure is measured by an appropriate pressure gauge; for example, a capacitance manometer 568. Providing a well-controlled pressure downstream of FRE 117 provides additional stabilization against pump drifts. Feedback control compensates for relatively slow changes, and any fast changes, for example on a scale faster than 10 seconds, are electronically filtered.

Synchronous modulation of flow and draw in accordance with the invention enables chemical-dosage at a very low flow rate. Generally, a smaller volume of the draw control chamber is preferable to a larger one. Firstly, a small-volume draw control chamber provides fast draw-control response in a system. Secondly, a small volume is more effectively purged during a purge stage than a large volume. For example, a deposition chamber adequately designed for the processing of 200 mm silicon wafers with a volume of about 400 cc operates well with a draw control chamber having a volume of 100 cc or less.

Embodiments in accordance with the invention are characterized by relatively low chemical-dosage flow and draw. In a conventional ALD apparatus, typical chemical dosage flow rates of several hundred sccm provide significant suppression of diffusion by the relatively high displacement of gas. In contrast, in embodiments in accordance with the invention, chemical-dosage flow rates are small (e.g., less than 50 sccm) by design. Small draw control chamber volumes are effectively purged during purge steps, thereby suppressing residual chemicals down to insignificant low levels. In addition, the typically high draw-gas flow rate during a chemical-dosage stage further dilutes the concentration of residual chemicals. Accordingly, diffusion is effectively suppressed.

Nevertheless, it is often desirable to utilize a large-volume draw control chamber in which abatement can be conducted. Additionally, an abatement element in a draw control chamber significantly increases the effective residence time of chemicals in the draw control chamber. In a system 100, as depicted in FIG. 1, the small draw from the deposition chamber maintained during chemical-dosage does not necessarily provide sufficient gas displacement to suppress material transport by diffusion back upstream into the deposition chamber when a large-volume control chamber is implemented. For example, $H_2O$ in $N_2$ at 300° C. has a diffusion constant D of about 3000 $cm^2$/sec in 200 mTorr of $N_2$. Accordingly, diffusion of $H_2O$ from draw control chamber 116 upstream into deposition chamber 114 could, under certain circumstances, deliver a significant flux of $H_2O$ into deposition chamber 114.

In certain preferred embodiments, therefore, effective suppression of back diffusion is obtained by providing a small-volume Draw Gas Introduction Chamber ("DGIC") between the deposition chamber and the draw control chamber. Diffusion from the DGIC back upstream into the deposition chamber is practically negligible. Diffusion from the large-volume (and long memory, by design) draw-control-abatement chamber into the DGIC, and subsequently into the deposition chamber, is suppressed by the high flow of draw gas from the DGIC into the draw control chamber.

Figure 12:
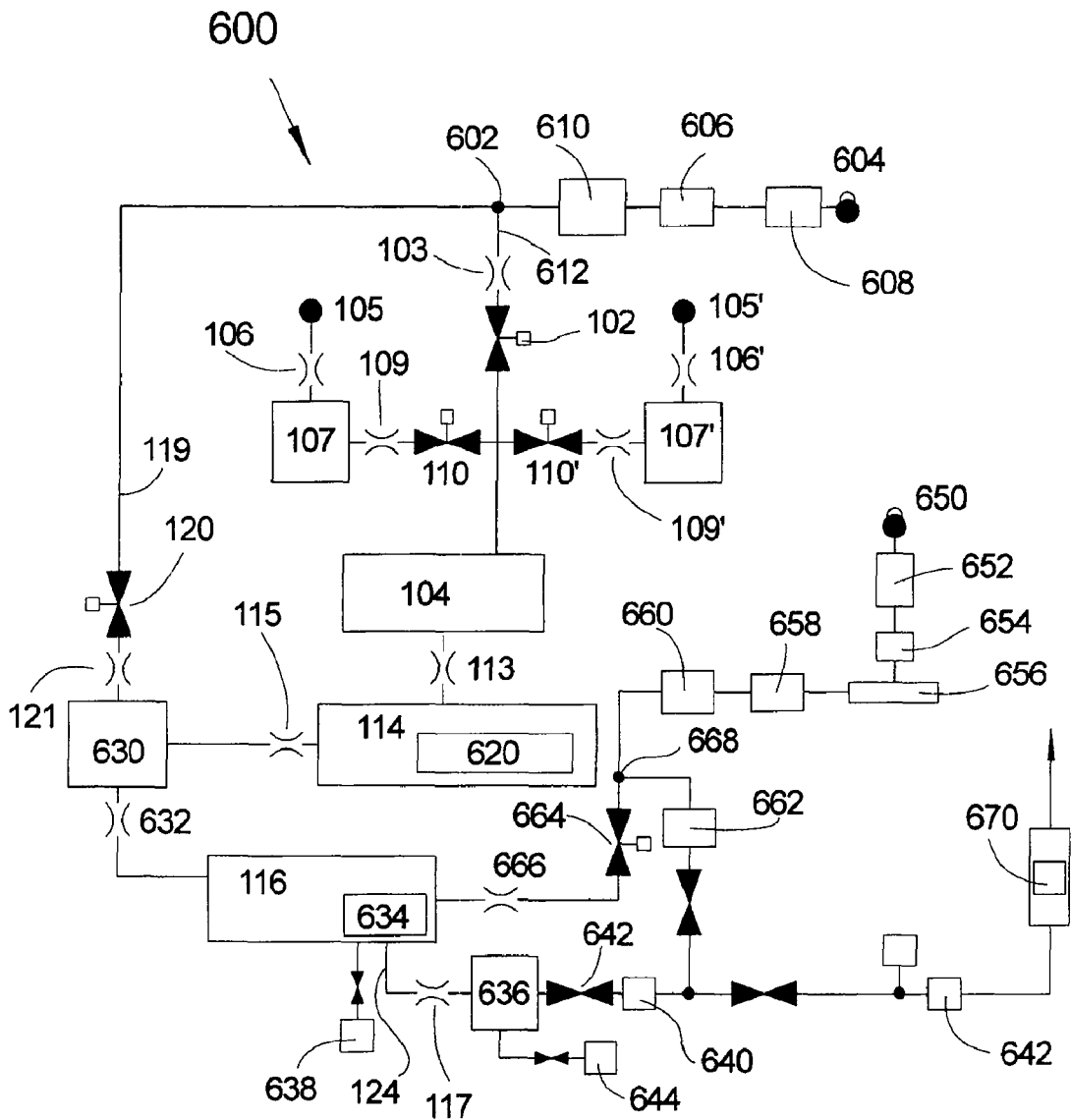
FIG. 12 depicts in schematic form an exemplary SMFD ALD system comprising a DGIC in accordance with the invention.

FIG. 12 depicts in schematic form an exemplary SMFD ALD gas-manifold system 600 comprising a DGIC and operated in accordance with the invention to provide high quality ALD thin films.

System 600 comprises a pressure-stabilized inert gas conduit 602, from which inert purge gas and inert draw gas flow. Inert gas cylinder 604 is connected through a gas pressure regulator as known in the art to a pressure controller 606. An MKS 640A-type pressure controller, for example, is suitable. A mass flow meter 608 conveniently defines and measures flow rates under steady-state flow conditions. Pressure undulations at conduit 602 are suppressed to an appropriate level, for example, below 0.1%, by gas preheat container 610. The volume of gas container 610, for example, 1.5 liters, is selected to suppress pressure undulations and to provide a sufficient residence time for the inert gas to reach substantially the temperature of the ALD gas manifold or any other chosen temperature.

Inert gas flow is split at conduit 602 into the ALD purge line 612 comprising purge-FRE 103, and into the draw control line 119. Another embodiment (not shown) includes separate pressure controllers and heating containers for the purge and draw portions of the manifold. It is understood by one skilled in the art that many different arrangements of purge-gas delivery and draw-gas delivery, including complete separation of the manifolds and the use of different and separate gas sources and different gas temperatures for purge and draw control, can be implemented in accordance with the invention.

Pressurized gas conduit 602 is in serial fluidic communication with gas distribution chamber 104 through purge-source-FRE 103 and purge-source shut-off valve 102. In a preferred embodiment, the functionality of FRE 103 is designed and incorporated into the construction of shut-off valve 102 to create a single device and to minimize pressure spikes that arise from the volume between valve 102 and FRE 103.

Purge gas is supplied through purge-source shut-off valve 102 and purge-source flow restriction element ("FRE") 103 into gas distribution chamber 104, which is commonly a showerhead. As depicted in FIG. 12, purge-source shut-off valve 102 and purge-source FRE 103 provide serial fluidic communication between purge-gas source 101 and gas distribution chamber 104. A chemical reactant precursor in the form of a pure chemical gas, a vapor from a liquid or solid chemical, or mixtures of vapor or gas chemicals with inert gas is provided at a well-controlled pressure at a plurality of chemical-gas sources 105, 105'. Chemical-gas source 105 is connected in serial fluidic communication with booster chamber 107 through chemical-source-FRE 106. Booster chamber 107 is connected in serial fluidic communication with gas distribution chamber (showerhead) 104 through chemical-dosage shut-off valve 110 and booster-FRE 109. As depicted in FIG. 12, chemical-dosage shut-off valve 110 and purge-exhaust shut-off valve 108 comprise a simple two-way valve in parallel branches of the gas manifold system of system 100, which branch off from junction 123.

As depicted in FIG. 12, second chemical-gas source 105' is connected to showerhead 104 with devices corresponding to those described with reference to chemical-gas source 105.

In preferred embodiments, the functionality of FRE 109 is designed and incorporated into the construction of chemical-dosage shut-off valve 110 to create a single device and to minimize pressure spikes that arise in the volume between FRE 109 and valve 110. Similarly, additional chemical sources, for example, chemical-gas source 105', are connected to flow distribution chamber 104 through corresponding manifold elements 106', 107', 109', and 110'.

Gas-distribution FRE 113 provides serial fluidic communication between gas distribution chamber 104 and atomic layer deposition chamber ("ALDC" or "deposition chamber") 114. In a preferred embodiment, in which gas distribution chamber 104 is a showerhead device, gas-distribution FRE 113 is commonly a nozzle array 113. A nozzle array provides restricted and uniform flow from gas distribution chamber 104 to deposition chamber 114, which contains a heated substrate holder 620. Deposition chamber 114 is connected in serial fluidic communication to a small-volume draw-gas introduction chamber ("DGIC") 630 through deposition-chamber FRE 115. Inert draw-gas source 604 is connected in serial fluidic communication to DGIC 630 through draw-gas line 119, draw-source shut-off valve 120, and draw-source-FRE 121. Draw-gas introduction chamber 630 is connected in serial fluidic communication through DGIC-FRE 632 to draw control chamber ("DC") 116. A chemical abatement element 634 is disposed inside draw control chamber 116. Draw control chamber 116 is connected in serial fluidic communication to pump chamber 636 through draw-control outlet 124 and draw-control FRE 117. A pressure gauge 638 is connected to draw control chamber 116. Pressure gauge 638, for example, an MKS Baratron model 628 type, monitors the process through, for example, the average pressure in draw control chamber 116. Similarly, other process monitoring devices (not shown), such as gas analyzers, can be conveniently connected to the draw control chamber 116. Low pressure gauge 644, such as an HPS I-Mag cold-cathode gauge, is attached to pump chamber 636 to monitor chamber pressure during idle time. Turbo molecular pump 640 is connected to pump chamber 636 through a pumping gate-valve 642 to facilitate high vacuum during idle time and high-throughput flow during ALD operation. For example, a pump selected from the BOC-Edwards STPA series is suitable. Good performance for ALD deposition on 200 mm silicon wafers was obtained using an STPA 1303C pump. Turbo molecular pump 640 is evacuated using backing pump 642. For example, a BOC QDP40 or equivalent serves well as backing pump 642. In other embodiments in accordance with the invention, higher pumping-speed pump arrangements, such as the QMB series from BOC Edwards, facilitate remote location placement of dry pumps, as known in the art.

In certain preferred embodiments, reactive gas is added to draw control chamber 116 to enhance chemical abatement. Accordingly, system 600 comprises an ozone-supply manifold. Oxygen or oxygen-nitrogen mixtures are supplied from gas cylinder 650. A mass flow controller 652 controls the flow of gas into a commercially available ozone generator 654. For example, the MKS Astex AX8407 series ozone generators perform well in SMFD system 600. The output from ozone generator 654 is monitored by ozone monitor 656, allowing feedback-control stabilization of ozone concentrations. Pressure controller 658, for example, an MKS 640A type, maintains a selected constant pressure inside ozone generator 654. For the purpose of pulsing ozone into DC 116 while maintaining controlled flow and pressure that are necessary for correct operation of ozone generator 654, an ozone reservoir 660 comprises a volume selected to suppress the impact of ozone-pulsing on the pressure inside ozone generator 654. This allows pulsing of reactive ozone into draw control chamber 116, while maintaining a desired flow and pressure in ozone generator 654. Pressure controller 662 controls the pressure in ozone reservoir 660. Ozone degradation is minimized in system manifold 600 by maintaining the ozone supply manifold at substantially room temperature and by minimizing the stagnant volume between ozone generator 654 and DC 116. For example, a stagnant volume is depicted schematically in FIG. 12 by the dead leg between valve 664 and junction 668. Ozone is fed to ozone shut-off valve 664 and ozone-source FRE 666 through the inner tubing of a double-wall line and fed to the inlet of pressure controller 662 by the return flow between the inner and the outer tubing. In this manner, the impact of ozone depletion in the stagnant space is minimized by reducing the dead leg between valve 664 and junction 668 to less than 1 cc. Preferably, an ozone-eliminating catalytic converter 670 is disposed at the outlet of pump 642 to suppress ozone emission to the ambient.

Figure 13:
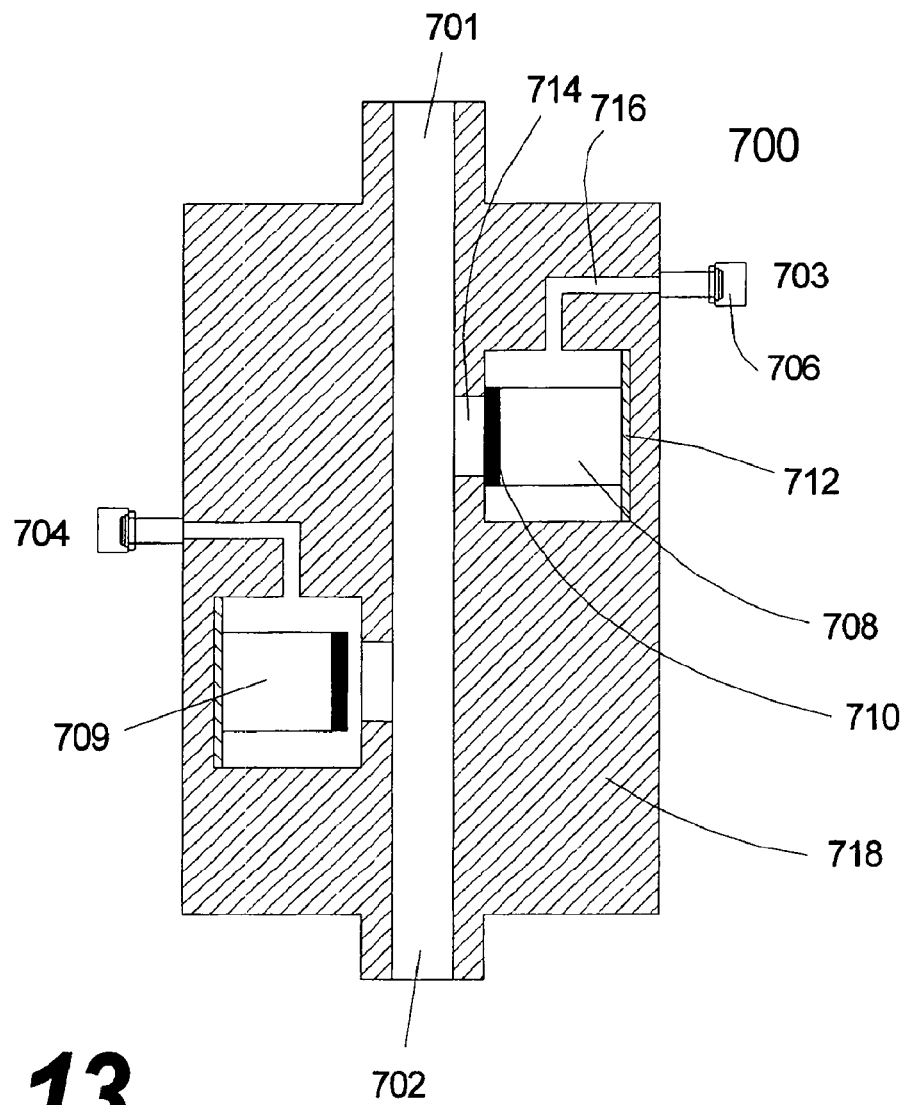
FIG. 13 depicts a multiple-port gas delivery valve used in accordance with the invention.

In a preferred embodiment, the functionality of chemical-dosage shut-off valves 110, 110' was integrated into a multiple-port chemical introduction valve 700, as depicted in FIG. 13. Valve 700 includes a purge gas path from inlet 701 to outlet 702. Chemical lines are connected using standard connections such as VCR or c-seal, as is known in the art; for example, a VCR2 connector (⅛" standard face seal) 706. Chemicals are supplied through flow path 716. The valve is sealed by normally closed actuator 708 that is externally sealed to valve body 718 using seal 712. Orifice 714 is dynamically sealed by elastomer 710 when actuator 708 is not energized. When the actuator is energized, such as illustrated for actuator 709, the flow path is open. This design minimizes the dead-leg associated with valve manifolds, since the volume of 714 can be maintained at $1-5 \times 10^{-4}$ cc. Electrically actuated valves with response time in the millisecond and submillisecond range are most suitable as actuators. For example, series 99 puppet valves manufactured by the General Valve Division of Parker Hannifin were implemented with dependable performance. Design valves 700 with a gas path 714 that is 2 mm long with a 2 mm diameter (~0.0004 cc volume) were tested and performed adequately under conditions in the range of from 500 sccm to 1200 sccm of purge gas and 2 Torr to 10 Torr pressure. Chemical introduction valve 700 simplifies ALD manifold design by eliminating the need for valve dead-leg purge-vent lines, such as line 112 in FIG. 1. Additional simplification is achieved by eliminating the need for chemical purge vent valves, such as 108 in FIG. 1.

Example 1

An exemplary SMFD ALD system corresponding to system 600 of FIG. 12 was designed and constructed for conducting SMFD ALD in accordance with the invention to deposit $Al_2O_3$ using the reactant gases trimethylaluminum ("TMA") and $H_2O$. Descriptions of the various components, identified using reference numerals of FIG. 12, of the exemplary system are included in Table 2, below, in which appropriate physical design, dimensions, and functional characteristics are entered. Preferred values of process parameters set, measured, or calculated during operation of the exemplary system are listed in Table 3. Definitions and explanatory notes, listed below Table 3, are referenced in Tables 2 and 3 by numbers (1) through (11).

TABLE 2

| Component Ref. No. | Design | Preferred Value |
| --- | --- | --- |
| 608 MFM (1) | MKS | 0 sccm-2000 sccm |
| 606 Pressure controller | MKS 640A | 0 Torr-1000 Torr |
| 610 Gas preheat box | Aluminum Container | 1500 cc |
| 103 FRE | Long Tube | 0.052 liter/sec (4) |
| 106 FRE | Long Tube | 0.030 liter/sec (5) |
| 106' FRE | Long Tube | 0.010 liter/sec (6) |
| 109 FRE | Long Tube | 0.52 liter/sec (5) |
| 109' FRE | Long Tube | 0.52 liter/sec (6) |
| 104 FDC | Round | 25 cc |
| 113 FRE | 624 nozzles equally spaced | 0.125" long; 0.055" diameter |
| 114 PC | Round (3) | 400 cc |
| 115 FRE | Round Gap (3) | 600 liter/sec (2) |
| 630 DFIC | Centro-symmetric (3) | 85 cc (approximated) |
| 632 FRE | Round (3) | 1000 liter/sec |
| 116 DC | Centro-symmetric (3) | 3 liter |
| 121 FRE | Long Tube | 0.56 liter/sec (7) |
| 666 FRE | Long Tube | 0.70 liter/sec (8) |
| 117 FRE | Centro-symmetric (3) | 80 liter/sec (2) |
| 636 pump chamber | Centro-symmetric (3) | ~1.5 liter |
| 640 Turbo Pump | BOC Edwards STPA 1303C | 1300 liter/sec, 3000 sccm |
| 107 $H_2O$ Booster | Cylindrical | 35 cc |
| 107' TMA Booster | Cylindrical | 5 cc |

TABLE 3

| Process Parameter | Typical Value |
| --- | --- |
| Wafer Temperature | 300° C. |
| Flow - Purge | 1000 sccm |
| Flow - Draw | 1100 sccm |

TABLE 3-continued

| Process Parameter | Typical Value |
| --- | --- |
| Flow TMA Initial | 500 sccm (9) |
| Flow $H_2O$ Initial | 810 sccm (9) |
| Flow TMA at steady-state | 9 sccm (9) |
| Flow $H_2O$ at steady-state | 45 sccm (9) |
| TMA Vapor Pressure | 12 Torr (10) |
| $H_2O$ Vapor Pressure | 20 Torr |
| DC Pressure - Purge | 160 mTorr |
| DC Pressure - Dosage | 230 mTorr |
| ALDC Pressure - Purge | 194 mTorr (11) |
| ALDC Pressure - TMA Dosage | 230.3 mTorr (11) |
| ALDC Pressure - $H_2O$ Dosage | 231.7 mTorr (11) |
| SH Pressure (Purge) | ~370 mTorr ($N_2$ at 140° C.) |
| Manifold Temperature | 140° C. |
| $N_2$ Pressure | 250 Torr |

Definitions and notes for Tables 2 and 3:
(1). MFM—Mass Flow Meter
(2). $N_2$ at 200 mTorr and 300° C.
(3). However, SMFD can be implemented to linearly flowing designs or any other designs, especially for coating substrates that are not round.
(4). $N_2$ at 250 Torr and 140° C.
(5). $H_2O$ at 20 Torr and 140° C.
(6). TMA at 12 Torr and 140° C.
(7). $N_2$ at 250 Torr and 35° C.
(8). $O_2$ at 250 Torr and 30° C.
(9). At 140° C., $N_2$ equivalent
(10). Based on Epichem data
(11). Calculated In the exemplary SMFD ALD system, the functionality of chemical-dosage shut-off valves 110, 110' was integrated into a multiple-port chemical introduction valve 700, as depicted in FIG. 13.

An SMFD ALD deposition of $Al_2O_3$ using the reactant gases trimethylaluminum ("TMA") and $H_2O$ was conducted in accordance with the invention using the apparatus and operating parameters specified in Tables 2 and 3. Valves 102, 700, and 120 were actuated in accordance with the invention to effect ALD cycles comprising a TMA-dosage, a TMA-purge, an $H_2O$-dosage, and an $H_2O$-purge. Dosage and purge times were varied and results studied to determine minimum dosage and purge times, as follows:

Trimethylaluminum dosage, minimum for saturation: 20 msec;

$H_2O$ dosage, minimum for saturation, 70 msec;

Trimethylaluminum purge: 100 msec; and $H_2O$ purge: 150 msec.

Measurements of thin films and gas composition produced the following results for preferred operating conditions:

Within wafer thickness uniformity: Max–Min.: <3%, sigma<1%.

Wafer to wafer thickness reproducibility (140 nm accumulated thickness):

<0.6% total range (<0.2% for sigma).

Trimethylaluminum utilization efficiency: >20%.

Trimethylaluminum booster effect: >98% at 10 msec.

In addition, ozone was used to facilitate effective abatement by removing TMA from the exhaust stream and producing a high-quality deposit on abatement element 634 (FIG. 12). In particular, an abatement element made from roughened aluminum with only ~3000 $cm^2$ area was used in conjunction with the process described in Table 3. Ozone was fed directly into the draw chamber in accordance with the apparatus that is illustrated in FIG. 12. Flow rates in the range of from 150 sccm-250 sccm were effectively implemented.

Figure 14:
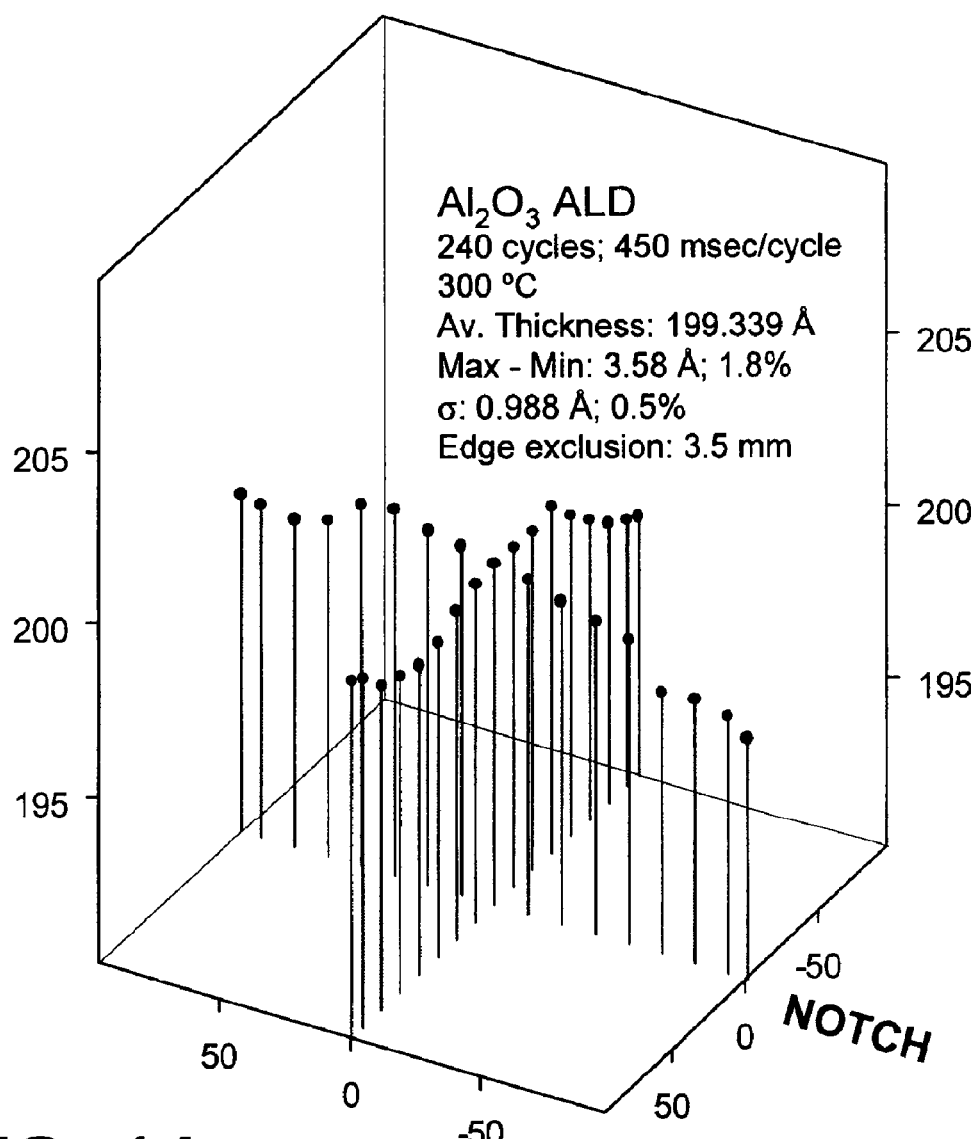
FIG. 14 depicts a 3-dimensional graph in which thin film thickness is plotted as a function of wafer-location on a 200 mm wafer substrate on which $Al_2O_3$ was deposited using an SMFD ALD apparatus and a method in accordance with the invention.

SMFD enables ALD with sub-second cycle time over standard semiconductor wafers. For example, 200 mm wafers were coated with exceptional uniformity and reproducibility using 240 cycles with a cycle time of 450 msec. FIG. 14 contains a wafer uniformity map of $Al_2O_3$-thin films deposited using the system and operating parameters listed in Tables 2 and 3. The substrate heater was set at 300° C. A woollam M-44 ellipsometer was used to measure the films. The uniformity map comprises 34 measurement points measured in a cross pattern with a 3.5 mm edge exclusion. The direction of the wafer notch is indicated. Wafer-to-wafer reproducibility under 450 msec cycle time conditions is better than 0.2% (1 sigma) tested over 1400 Å of accumulated thickness. A 1400 Å was used as a standard for wafer-to-wafer reproducibility to provide comparison to a typical 25-wafer lot with 50 Å thickness (total of 1250 Å). Adequate performance without any noticeable degradation was maintained after the deposition of several microns of accumulated thickness without chamber maintenance.

SMFD is useful for depositing films on a wide range of substrate sizes, from <1 $cm^2$ for research purposes up to large >1 $m^2$ substrate areas. The physical size of the substrate dictates the shape and volume of the ALD chamber and dictates the scaling of most design features and process parameters. Embodiments of the invention described in this specification, especially in Example 1, were designed principally for processing of 200 mm semiconductor wafers. It is clear that one skilled in the art is able to scale SMFD systems and processes in accordance with the invention for different-sized substrates and different production requirements in the semiconductor arts, as well as in other fields of application. In addition, most apparatus and process design parameters scale with the properties of the vacuum pump. Accordingly, system performance and apparatus design is tied into the choice of the vacuum pump. Specifically, the embodiment exemplified in Tables 2 and 3 is dictated by the maximum flow that could be utilized adequately with BOC Edwards—Seiko-Seiki STPA1303C, namely, about 1500 sccm.

Figure 15:
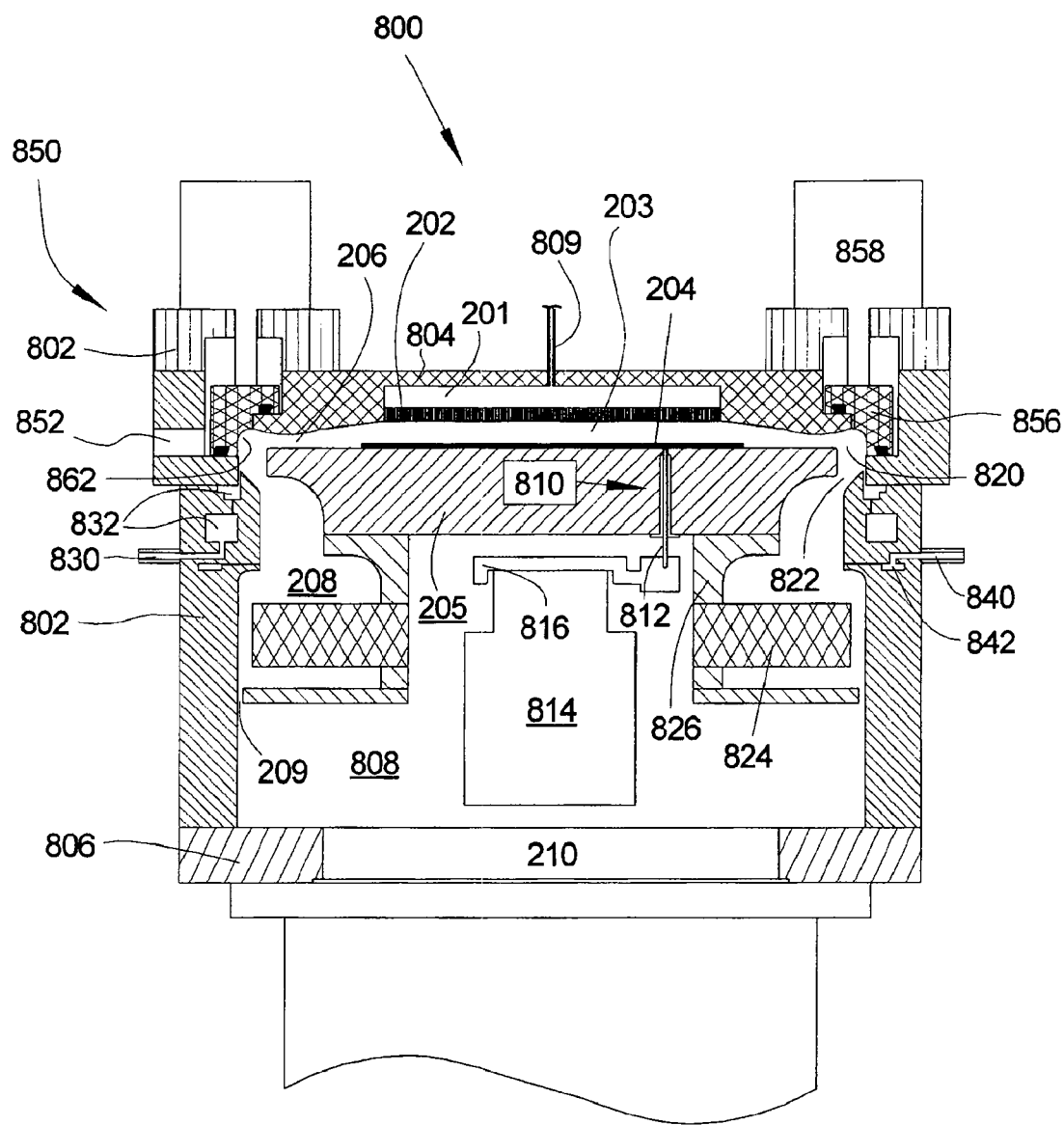
FIG. 15 depicts in schematic form a cross-section of a preferred embodiment of an ALD reactor vessel containing a DGIC and a PSV (in the closed position) in accordance with the invention.
Figure 16:
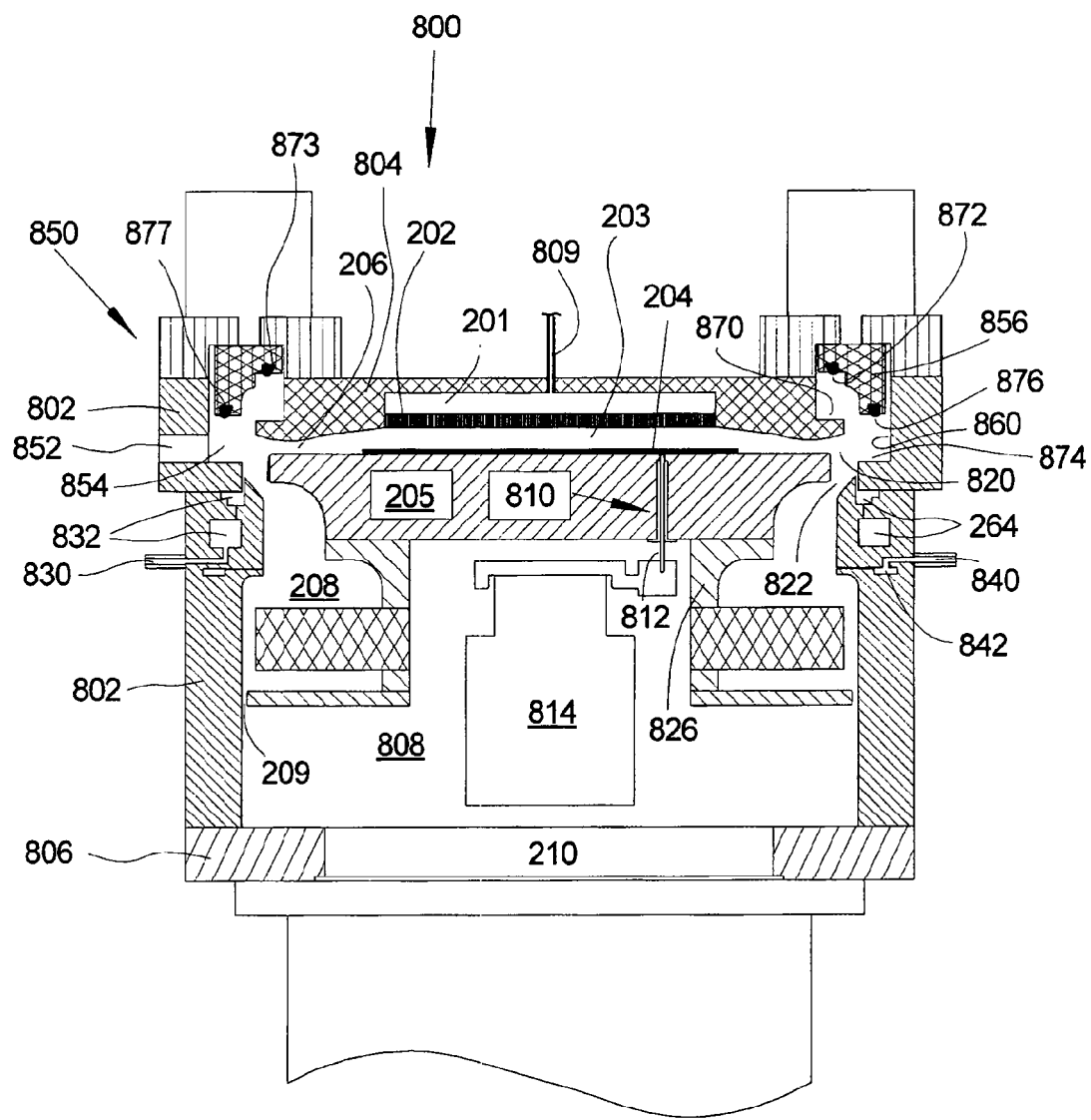
FIG. 16 depicts the reactor vessel of FIG. 15 in which the PSV is in the open position.

FIGS. 15 and 16 depict in schematic form a cross-section of a preferred ALD reactor vessel 800. As shown in FIG. 15, reactor vessel 800 comprises a reactor-vessel wall 802, a reactor-vessel top 804, and a vessel-bottom 806, which define a vessel interior 808. Reactor vessel 800 includes gas distribution chamber (showerhead) 201. A showerhead inlet 809 at top 804 serves as an inlet for chemical reactant gases and purge gases into showerhead 201. Nozzle array (FRE) 202 separates the bottom of gas distribution chamber 201 from ALD deposition chamber (process chamber) 203. A substrate 204 is supported on heated wafer chuck (substrate holder) 205, made from a thermally conducting metal (e.g., W, Mo, Al, Ni) or other materials commonly used in the art for hot susceptors and chucks. Wafer chuck 205 includes a wafer lift-pin mechanism 810. Wafer transport is accomplished with the aid of lift pins 812 (only one out of three pins shown), as known in the art. Wafer lift pins 812 are actuated to lift wafer substrate 204 above the top surface of chuck 205 using actuator 814 and levitation arm 816. Deposition chamber 203 is confined by deposition-chamber FRE 206. A draw-gas introduction chamber ("DGIC") 820 is located downstream from deposition chamber 203, between FRE 206 and DGIC-FRE 822. A draw control chamber ("DC") 208 is located downstream from DGIC, and is confined by DGIC-FRE 822 and draw-control FRE baffle 209. Chemical-abatement element 824 is disposed inside draw control chamber 208. Spacer 826 provides direct thermal contact of chemical-abatement element 824 and draw-control FRE baffle 209 with heated wafer chuck 205.

Draw-gas inlet 830 provides serial fluidic communication between a draw-gas manifold (not shown) and a draw gas plenum 832. One skilled in the art can implement draw gas plenum 832 in many different configurations, and the embodiment shown in FIGS. 15 and 16 is a non-exclusive example. As depicted in FIG. 15, draw-gas inlet 830 is in serial fluidic communication with radial plenum space 832, which further communicates with DGIC 820 through a radial array of nozzles (not shown), which are appropriately spaced and designed to unify the radial flow distribution of gas into DGIC 820 and direct draw gas into the upstream portion of DGIC 820. One skilled in the art appreciates the importance of adequately unifying the flow of draw gas and reactive abatement gas to conform to the symmetry of the deposition system; for example, the radial symmetry of the system depicted in FIGS. 15 and 16.

Optionally, reactive gas is delivered from a reactive gas manifold (not shown) through line 840 into reactive-gas plenum 842. Reactive-gas plenum 842 serves to shape a uniform radial flow distribution of reactive abatement gas into draw chamber 208. For example, the reactive gas is delivered into a radial channel that communicates with draw chamber 208 through a plurality of horizontal nozzles that are appropriately spaced and designed. One skilled in the art can appreciate that reactive gas plenum system 842 can be implemented in many different configurations in accordance with the invention.

During ALD processing, purge gas during a purge stage and chemical reactant gas during a chemical-dosage stage flow along a process-gas flow-path through reactor-vessel interior 808 in a downstream direction from showerhead inlet 809 through showerhead 201, deposition chamber 203, DGIC 820, and draw control chamber 208, in that order, and out of reactor vessel 800 through vacuum port 210. Similarly, draw gas introduced into DGIC 820 flows in a downstream direction from DGIC 820 into draw control chamber 208 and then exits through vacuum port 210. The terms "downstream" and "upstream" are used herein in their usual sense. It is a feature of embodiments in accordance with the invention that back-flow of gases, that is, the flow of gases in an "upstream" direction, never occurs, as explained above. The term "upstream" is used in this specification, however, to designate the relative locations of components and parts of a system.

Reactor vessel 800 further includes a perimeter slot valve ("PSV") 850. As depicted in FIGS. 15 and 16, PSV 850 comprises a substrate-transport slot 852 through reactor-vessel wall 802, a continuous perimeter cavity 854 (FIG. 16) within reactor-vessel wall 802, a continuous perimeter-sealing poppet 856, and an actuator 858 for moving sealing poppet 856 between an open position (FIG. 16) and a closed position (FIG. 15). Sealing poppet 856 is moved into perimeter cavity 854 in the closed position (FIG. 15), and sealing poppet 856 is moved out of perimeter cavity 854 in the open position (FIG. 16). Substrate-transport slot 852 is substantially coplanar with the substrate-supporting surface of substrate holder 205. Perimeter cavity 854 is substantially coplanar with substrate-transport slot 852. Substrate-transport slot 852 defines a substrate-transport channel through reactor-vessel wall 802 to substrate holder 205 when sealing poppet 856 is in its open position (FIG. 16), and sealing poppet 856 separates substrate-transport slot 852 from vessel interior 808 when sealing poppet 856 is in its closed position (FIG. 15).

As depicted in FIG. 16, reactor-vessel wall 802 defines a vessel perimeter 860 within the reactor-vessel wall, and sealing poppet 856 conforms to vessel perimeter 860 when sealing poppet 856 is in its closed position (FIG. 15). Perimeter cavity 854 is continuous in the sense that the cavity continuously surrounds deposition chamber 203 and DGIC 820. Sealing poppet 856 is continuous in the sense that, in the closed position, it continuously fills perimeter cavity 854 surrounding deposition chamber 203 and DGIC 820, and thereby continuously seals the interior 808 from substrate-transport slot 852 and from the exterior of vessel 800. As depicted in FIGS. 15 and 16, reactor-vessel wall 802 comprises a substantially radially symmetric shape, and sealing poppet 856 comprises a substantially radially symmetric shape. It is understood that other embodiments of reactor vessel 800 and PSV 850 in accordance with the invention could have other geometric shapes. As depicted in FIG. 15, sealing poppet 856 in its closed position forms an inner sealing wall 862 of the process-gas flow-path in vessel interior 808. Inner sealing wall 862 comprises a radially symmetrical shape, which promotes a radially symmetric flow of gases along the process-gas flow-path and, thereby, enhances uniform deposition and reduces formation of solid deposits. In the particular embodiment of reactor vessel 800 as depicted in FIG. 15, a portion of inner sealing wall 862 defines a portion of DGIC 820. As depicted in FIG. 16, PSV 850 comprises a fixed upper sealing surface 870, an upper poppet sealing surface 872 corresponding to fixed upper sealing surface 870, an upper peripheral seal 873, a fixed lower sealing surface 874, a lower poppet sealing surface 876 corresponding to fixed lower sealing surface 874, and a lower peripheral seal 877. Upper sealing surfaces 870, 872, lower sealing surfaces 874, 876, and peripheral seals 873, 877 are configured to seal the vessel interior when sealing poppet 856 is in its closed position (FIG. 15).

As depicted in FIG. 16, upper peripheral seal 873 and lower peripheral seal 877 are assembled on poppet sealing surfaces 872, 876, respectively. Also, seals 873, 877 are configured as o-ring seals. It is clear that different types of seals, for example, flat gasket seals, are useful, and that seals 873, 877 can be assembled on fixed sealing surfaces 870, 874, instead of on poppet sealing surfaces 872, 876. Suitable materials for seals 873, 877 include elastomer materials made from Viton, Kalrez, Chemraz, or equivalents. One skilled in the art is capable of implementing perimeter slot valve 850 in many different configurations.

Substrate-transport slot 852 and the associated wafer transport system communicated through slot 852 are completely isolated from the ALD process system in reactor vessel interior 808 when PSV 850 is closed.

Operation of a preferred embodiment in accordance with the invention revealed that the high flow of inert gas into the leading edge of the DFIC during chemical dosage was sufficient to provide good protection against possible film buildup in the radial crevices that are formed between 804 and 856 and between 856 and 802. Accordingly, PSV was implemented with no adverse impact on maintenance cycle.

Figure 17:
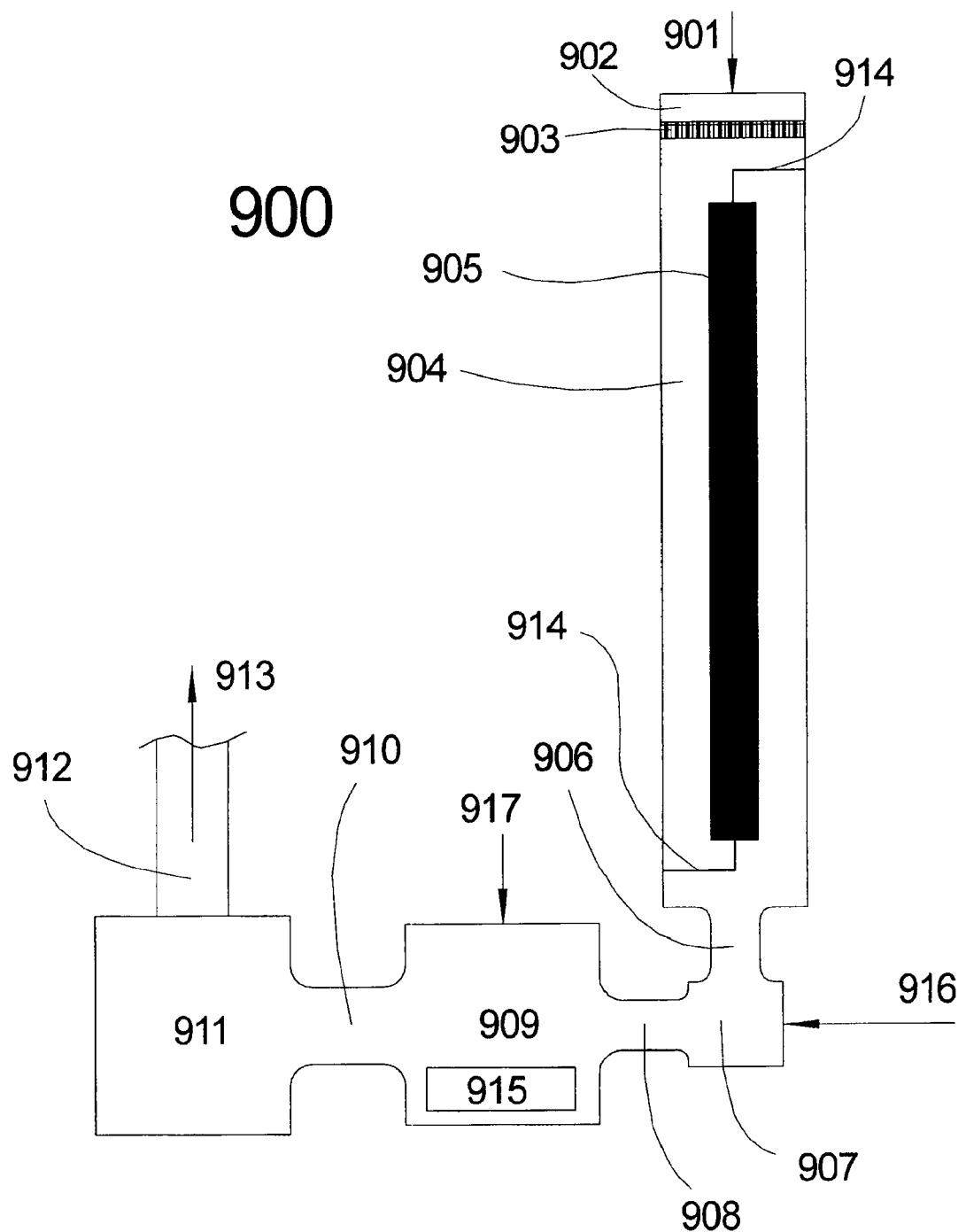
FIG. 17 depicts in schematic form an SMFD system in accordance with the invention designed for non-centrosymmetric flow in the process chamber.

FIG. 17 depicts in schematic form an SMFD system 900 in accordance with the invention designed for non-centrosymmetric flow in the process chamber. While the preferred embodiment in accordance with the invention was described mainly in terms of a centrosymmetric flow system, those skilled in the art understand that SMFD design is applicable for other flow designs. Typically, the design of the deposition chamber and the flow path should be optimized to the shape of the substrate and the method of choice for controlling substrate temperature. For example, round thin substrates where deposition is intended to be on one side of the substrate, such as semiconductor wafers, would best fit centrosymmetric systems with a bottom supporting heatable chuck. However, centrosymmetric systems would not be best suitable for substrates that are substantially not round. For example, SMFD system 900 in FIG. 17 is designed for efficient deposition on a rod- or a tube-shaped substrate 905. The substrate is disposed in an elongated chamber 904, having preferably a substantially similar geometry (to substrate 905). For example, deposition chamber 904 may be made of a glass tube that is 10 millimeters wider than substrate 905. Substrate 905 is supported at the ends by clamps 914. Heating can be realized by, for example, inductive coils or by placing deposition chamber 904 inside a conventional furnace heating-jacket. Gas is fed from 901 into a gas distribution chamber 902 and further distributed by nozzle array 903. Deposition chamber 904 is connected through FRE 906 to DGIC 907. DGIC 907 is supplied with draw-control gas 916 in accordance with the principles of SMFD methods. DGIC 907 is further connected to DC 909 through FRE 908. Abatement element 915 is located in DC 909. Reactive gas inlet 917 is connected to DC 909 to facilitate efficient abatement. DC 909 is further connected through FRE 910 to pump compartment 911. Pump compartment 911 is evacuated by pump 913 through foreline 912. Preferably, pumping is achieved using BOC Edwards iQMB 1200F or BOC Edwards IPX500A or equivalent pumps.

Systems, apparatuses, and methods designed and operated in accordance with the invention are particularly useful in ALD technology. Synchronous modulation of flow and draw, SMFD, is also useful, however, in a wide variety of circumstances and applications. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. Since certain changes may be made in the above systems and methods without departing from the scope of the invention, it is intended that all subject matter contained in the above description or shown in the accompanying drawings be interpreted as illustrative and not in a limiting sense. Consequently, the invention is to be construed as embracing each and every novel feature and novel combination of features present in or inherently possessed by the systems, devices, and methods described in the claims below and by their equivalents.

What is claimed as new and desired to be protected by Letters Patent of the United States is:

1. A perimeter slot valve in a process vessel having a process-vessel wall comprising:
   a substrate-transport slot through said process-vessel wall;
   a continuous perimeter cavity within said process-vessel wall;
   a continuous perimeter-sealing poppet; and
   an actuator for moving said sealing poppet between an open position and a closed position;
   wherein said sealing poppet is moved into said perimeter cavity in said closed position, said sealing poppet is moved out of said perimeter cavity in said open position, said substrate-transport slot is substantially coplanar with a substrate-supporting surface of said substrate holder, said perimeter cavity is substantially coplanar with said substrate-transport slot, said substrate-transport slot defines a substrate-transport channel through said process-vessel wall to said substrate holder when said sealing poppet is in said open position, and said sealing poppet separates said substrate-transport slot from said vessel interior when said sealing poppet is in said closed position;
   wherein said perimeter slot valve comprises:
   a fixed upper perimeter-sealing surface;
   an upper-poppet perimeter-sealing surface corresponding to said fixed upper perimeter-sealing surface;
   an upper peripheral seal;
   a fixed lower perimeter-sealing surface;

a lower-poppet perimeter-sealing surface corresponding to said fixed lower perimeter-sealing surface; and
a lower peripheral seal;
wherein said upper sealing surfaces, said lower sealing surfaces, and said peripheral seals are configured to seal said process vessel interior when said sealing poppet is in said closed position.

2. A system as in claim 1 wherein said process-vessel wall defines a vessel perimeter within said process vessel, and said sealing poppet conforms to said vessel perimeter when said sealing poppet is in said closed position.

3. A system as in claim 1 wherein said process-vessel wall comprises a substantially radially symmetric shape, and said sealing poppet comprises a substantially radially symmetric shape.

4. A system as in claim 1 wherein said sealing poppet in said closed position forms an inner sealing wall of a process-gas flow path in said process vessel interior.

5. A system as in claim 4 wherein said inner sealing wall comprises a radially symmetrical shape.

* * * * *